(12) United States Patent
Matsushima et al.

(10) Patent No.: US 11,476,435 B2
(45) Date of Patent: Oct. 18, 2022

(54) FILM AND ORGANIC LIGHT-EMITTING DEVICE CONTAINING PEROVSKITE-TYPE COMPOUND AND ORGANIC LIGHT-EMITTING MATERIAL

(71) Applicant: KYUSHU UNIVERSITY, NATIONAL UNIVERSITY CORPORATION, Fukuoka (JP)

(72) Inventors: Toshinori Matsushima, Fukuoka (JP); Chihaya Adachi, Fukuoka (JP); Chuanjiang Qin, Fukuoka (JP); Sangarange Don Atula Sandanayaka, Fukuoka (JP); Fatima Bencheikh, Fukuoka (JP); Takeshi Komino, Fukuoka (JP)

(73) Assignee: KYUSHU UNIVERSITY, NATIONAL UNIVERSITY CORPORATION, Fukuoka (JP)

( * ) Notice: Subject to any disclaimer, the term of this patent is extended or adjusted under 35 U.S.C. 154(b) by 227 days.

(21) Appl. No.: 16/640,767

(22) PCT Filed: Jul. 24, 2018

(86) PCT No.: PCT/JP2018/027757
§ 371 (c)(1),
(2) Date: Feb. 21, 2020

(87) PCT Pub. No.: WO2019/039174
PCT Pub. Date: Feb. 28, 2019

(65) Prior Publication Data
US 2020/0220094 A1 Jul. 9, 2020

(30) Foreign Application Priority Data

Aug. 24, 2017 (JP) ............................. JP2017-161660
Jun. 19, 2018 (JP) ............................. JP2018-116173

(51) Int. Cl.
*H01L 29/08* (2006.01)
*H01L 51/50* (2006.01)
*C09K 11/06* (2006.01)

(52) U.S. Cl.
CPC .......... *H01L 51/5024* (2013.01); *C09K 11/06* (2013.01)

(58) Field of Classification Search
CPC ........................... H01L 51/5024; C09K 11/06
See application file for complete search history.

(56) References Cited

U.S. PATENT DOCUMENTS 6,420,056 B1 7/2002 Chondroudis et al.
9,153,788 B2 10/2015 Adachi
(Continued)

FOREIGN PATENT DOCUMENTS

CN 102442939 A 5/2012
JP H09-53068 A 2/1997
(Continued)

OTHER PUBLICATIONS

Chinese office action dated Dec. 23, 2021 from corresponding Chinese patent application No. 201880054372.9.
(Continued)

*Primary Examiner* — Caleb E Henry
(74) *Attorney, Agent, or Firm* — Browdy and Neimark, PLLC

(57) ABSTRACT

Using a perovskite-type compound, an inexpensive host material having a high carrier mobility can be provided. Using a perovskite-type compound as a host material, an inexpensive organic light-emitting device having a high emission efficiency can be realized.

10 Claims, 8 Drawing Sheets

(56) References Cited

U.S. PATENT DOCUMENTS

| | | | |
|---|---|---|---|
| 9,502,668 B2 | 11/2016 | Adachi | |
| 9,634,262 B2 | 4/2017 | Adachi | |
| 9,660,198 B2 | 5/2017 | Nakagawa | |
| 9,793,492 B2 | 10/2017 | Adachi | |
| 9,818,955 B2 | 11/2017 | Kaji | |
| 9,985,215 B2 | 5/2018 | Adachi | |
| 10,032,995 B2 | 7/2018 | Adachi | |
| 10,454,038 B2 | 10/2019 | Nakagawa | |
| 2008/0150422 A1* | 6/2008 | Ohara | H01L 51/5048 313/504 |
| 2011/0079817 A1* | 4/2011 | Ohara | H01L 51/5048 257/E33.013 |
| 2013/0285039 A1* | 10/2013 | Ishihara | H01L 51/504 257/40 |
| 2015/0141642 A1 | 5/2015 | Adachi | |
| 2015/0239880 A1 | 8/2015 | Adachi | |
| 2015/0357582 A1 | 12/2015 | Hirata | |
| 2016/0254472 A1* | 9/2016 | Wang | C23C 14/0694 136/263 |
| 2017/0047530 A1* | 2/2017 | Ma | H01L 51/0034 |
| 2017/0222162 A1* | 8/2017 | Lee | H01L 51/0034 |
| 2017/0346031 A1* | 11/2017 | Lee | H01L 51/5096 |
| 2018/0040769 A1* | 2/2018 | Gao | H01L 33/005 |
| 2018/0047928 A1 | 2/2018 | Kim | |
| 2018/0233688 A1* | 8/2018 | Chen | H01L 51/50 |
| 2018/0248135 A1* | 8/2018 | Yu | H01L 51/0023 |
| 2018/0261396 A1* | 9/2018 | Gotanda | H01L 51/0047 |
| 2018/0277309 A1* | 9/2018 | Etgar | H01L 51/0077 |
| 2018/0298278 A1* | 10/2018 | Zhong | C09K 11/664 |
| 2018/0309078 A1* | 10/2018 | Ju | H01L 51/5088 |
| 2019/0259961 A1* | 8/2019 | Congreve | H05B 33/14 |
| 2020/0044176 A1* | 2/2020 | Xu | H01L 51/5088 |

FOREIGN PATENT DOCUMENTS

| | | |
|---|---|---|
| JP | 2001-060497 A | 3/2001 |
| JP | 2002-083683 A | 3/2002 |
| JP | 2013-116975 A1 | 6/2013 |
| JP | 2013-253121 A | 12/2013 |
| JP | 2013-256490 A1 | 12/2013 |
| JP | 2014-9224 A | 1/2014 |
| JP | 2014-9352 A | 1/2014 |
| JP | 2015-129240 A | 7/2015 |
| JP | 2015-162409 A | 9/2015 |
| JP | 2016-132638 A | 7/2016 |
| JP | 2017-112186 A | 6/2017 |
| KR | 10-2001-0015084 | 2/2001 |
| WO | 2013/011954 A1 | 1/2013 |
| WO | 2013/011955 A1 | 1/2013 |
| WO | 2013/081088 A1 | 6/2013 |
| WO | 2013/133359 A1 | 9/2013 |
| WO | 2013/154064 A1 | 10/2013 |
| WO | 2013/161437 A1 | 10/2013 |
| WO | 2014/034535 A1 | 3/2014 |
| WO | 2014/115743 A1 | 7/2014 |
| WO | 2014/122895 A1 | 8/2014 |
| WO | 2014/126200 A1 | 8/2014 |
| WO | 2014/133121 A1 | 9/2014 |
| WO | 2014/136758 A1 | 9/2014 |
| WO | 2014/136860 A1 | 9/2014 |
| WO | 2014/168101 A1 | 10/2014 |
| WO | 2014/189122 A1 | 11/2014 |
| WO | 2014/196585 A1 | 12/2014 |
| WO | 2014/203840 A1 | 12/2014 |
| WO | 2015/002213 A1 | 1/2015 |
| WO | 2015/008580 A1 | 1/2015 |
| WO | 2015/016200 A1 | 2/2015 |
| WO | 2015/019725 A1 | 2/2015 |
| WO | 2015/072470 A1 | 5/2015 |
| WO | 2015/072537 A1 | 5/2015 |
| WO | 2015/080182 A1 | 6/2015 |
| WO | 2015/080183 A1 | 6/2015 |
| WO | 2015/108049 A1 | 7/2015 |
| WO | 2015/129714 A1 | 9/2015 |
| WO | 2015/129715 A1 | 9/2015 |
| WO | 2015/133501 A1 | 9/2015 |
| WO | 2015/136880 A1 | 9/2015 |
| WO | 2015/137136 A1 | 9/2015 |
| WO | 2015/137202 A1 | 9/2015 |
| WO | 2015/137244 A1 | 9/2015 |
| WO | 2015/146541 A1 | 10/2015 |
| WO | 2015/159541 A1 | 10/2015 |
| WO | 2017/057313 A1 | 4/2017 |
| WO | 2018/168638 A1 | 9/2018 |

OTHER PUBLICATIONS

Japanese and English version of International Preliminary Report on Patentability of Chapter I, i.e., International Search Opinion dated Feb. 21, 2020.

International Search Report and Search Opinion in corresponding international application PCT/JP2018/027757, dated Oct. 30, 2018.

Sojerd Veldhuis et a., "Perovskite Materials for Light-Emitting Diodes and Lasers", Advanced Materials, Aug. 24, 2016, vol. 28, Issue 32, p. 6804-6834.

Office Action dated Jun. 14, 2022, issued in the corresponding Japanese patent application No. 2019-538010 with its English Machine Translation.

Office Action dated Jun. 2, 2022, issued in the corresponding Chinese patent application No. 201880054372.9 with its English Machine Translation.

Office Action dated Sep. 2, 2022, in corresponding Korean patent application No. 10-2020-7005694 with its English Machine Translation.

* cited by examiner

FILM AND ORGANIC LIGHT-EMITTING DEVICE CONTAINING PEROVSKITE-TYPE COMPOUND AND ORGANIC LIGHT-EMITTING MATERIAL

TECHNICAL FIELD

The present invention relates to a host material usable as a material for a light-emitting layer of an organic light-emitting device.

BACKGROUND ART

Studies for enhancing the light emission efficiency of organic light-emitting devices such as organic electroluminescent devices (organic EL devices) are being made actively. In particular, as a result of intensive studies promoted for materials of light-emitting layers of organic electroluminescent devices, various organic compounds usable in light-emitting layers have been developed. Here, a light-emitting layer of an organic light-emitting device generally contains a dopant material that plays a role of light emission and a host material that carries a function of carrier transport for electrons and holes and a function of excited energy transfer, in which a dopant is uniformly dispersed in the host material. Of course, accordingly, not only characteristics of a light-emitting material but also characteristics such as carrier mobility through a host material have a significant influence on the device characteristics of an organic light-emitting device. From such viewpoints, as a host material, various organic compounds having a carrier transport performance such as mCBP represented by the following formula have been proposed (for example, see NPL 1).

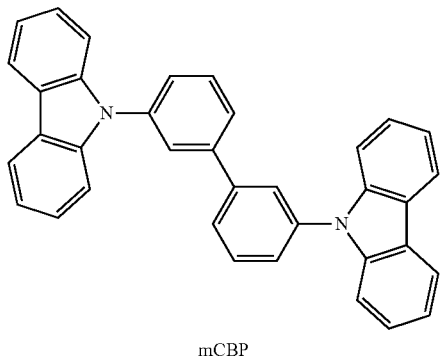 [SMILES: c1cc(-c2cccc(-n3c4ccccc4c4ccccc43)c2)cc(-n2c3ccccc3c3ccccc32)c1]

mCBP

CITATION LIST

Non-Patent Literature

NPL 1: Shizuo Tokito, Chihaya Adachi and Hideyuki Murata, "Yuki EL Display" (Organic EL Display) (Ohm-sha, Ltd.)

SUMMARY OF INVENTION

Technical Problem

However, the host materials that have been heretofore proposed in the art have some problems in that the carrier mobility therethrough is low and therefore the light emission efficiency of organic light-emitting devices could not be increased up to a high level. In addition, already-existing host materials have relatively complicated chemical structures and it takes a lot of work in producing them, and therefore there occurs another inconvenience of expensiveness.

Given the situation and for solving the prior art problems, the present inventors have promoted assiduous studies for the purpose of providing inexpensive host materials having a high carrier mobility. In addition, the inventors have further made assiduous investigations for realizing an organic light-emitting device that is inexpensive and has a high light emission efficiency.

Solution to Problem

As a result of assiduous studies, the present inventors have found that a perovskite-type compound has a high carrier mobility and can readily induce reverse intersystem crossing from an excited triplet state to an excited singlet state to efficiency produce a singlet exciton. With that, the present inventors have further found that, when such a perovskite compound is used as a host material in a light-emitting layer, an organic light-emitting device having a low drive voltage, having a high light emission efficiency and excellent in operational stability. In addition, the present inventors have found that a perovskite-type compound is an ionic compound composed of an organic cation having a relatively simple chemical structure, a divalent metal ion and a halide ion, and can be produced in a simple process as mentioned below, and therefore can realize an inexpensive host material. The present invention is proposed here based on such findings, and concretely has the following constitution.

[1] A host material containing a perovskite-type compound.
[2] The host material according to [1], wherein the carrier mobility through the perovskite-type compound is $10^{-2}$ to $10^{3}$ cm$^2$V$^{-1}$s$^{-1}$.
[3] The host material according to [1] or [2], wherein the perovskite-type compound is represented by the following general formula (4):

$$A^3BX_3 \quad (4)$$

wherein $A^3$ represents an organic cation, B represents a divalent metal ion, X represents a halide ion, and three X's may be the same as or different from each other.
[4] A film containing a perovskite-type compound and an organic light-emitting material.
[5] The film according to [4], wherein the perovskite-type compound is represented by the following general formula (4):

$$A^3BX_3 \quad (4)$$

wherein $A^3$ represents an organic cation, B represents a divalent metal ion, X represents a halide ion, and three X's may be the same as or different from each other.
[6] The film according to [4] or [5], wherein the organic light-emitting material emits light by the energy having transferred from the perovskite-type compound.
[7] The film according to any one of [4] to [6], wherein the organic light-emitting material is a compound having a coumarin skeleton.
[8] The film according to any one of [4] to [7], wherein the inclination of a single logarithmic chart on a graph where the horizontal axis indicates a common logarithm of an excitation light intensity and the vertical axis indicates a photoluminescence quantum yield is positive.

[9] An organic light-emitting device having a light-emitting layer that contains a perovskite-type compound and an organic light-emitting material.
[10] The organic light-emitting device according to [9], wherein the light-emitting layer is a film of any one of [4] to [8].
[11] The organic light-emitting device according to [9] or [10], which is an organic electroluminescent device.

Advantageous Effects of Invention

The host material of the present invention has a high carrier mobility and is inexpensive. By constituting a light-emitting layer using the host material of the present invention and an organic light-emitting material, there can be realized an organic light-emitting device having a low drive voltage, having a high light emission efficiency and excellent in operational stability, and the material cost for the organic light-emitting device can be reduced.

DESCRIPTION OF EMBODIMENTS

Figure 1:
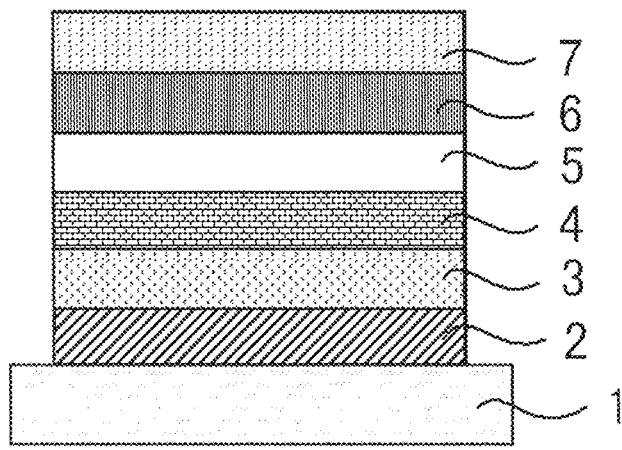
FIG. 1 This is a schematic cross-sectional view showing an example of layer configuration of an organic electroluminescent device.

Hereafter, the present invention is described in detail. As provided below, the constituent elements may be described based on representative embodiments and specific examples of the present invention, but the present invention is not limited to such embodiments and specific examples. As used herein, a numerical range expressed using "to" means a range that includes the numerical values before and after "to" as the minimum and maximum values, respectively. As used herein, a "major constituent" refers to a constituent that accounts for the largest portion of the content of something. A hydrogen atom present in a compound molecule used in the present invention is not particularly limited in terms of isotopic species. For example, all hydrogen atoms in a molecule can be $^1$H, or all or part of them can be $^2$H [heavy hydrogen (deuterium) D].

<Host Material>

The host material of the present invention contains a perovskite-type compound.

The "perovskite-type compound" in the present invention is an ionic compound composed of an organic cation, a divalent metal ion and a halide ion, and can form a perovskite-type crystal structure. The host material may be composed of a perovskite-type compound alone, or may contain any other component, but is preferably composed of a perovskite-type compound as a major constituent. Here, the wording "composed of a perovskite-type compound as a major constituent" means that 51% by weight or more of the host material is composed of a perovskite-type compound.

A perovskite-type compound has a relatively broad band gap, in which, therefore, carriers tend to readily diffuse, and which has a high carrier mobility. Consequently, using a perovskite-type compound as a host material in a light-emitting layer, an organic light-emitting device having a low drive voltage and having a high light emission efficiency (current efficiency) can be realized.

In addition, a perovskite-type compound is such that the lowest excited singlet energy level $S_1$ and the lowest excited triplet energy level $T_1$ are extremely close to each other, and therefore, when having transited to an excited triplet state, the compound readily undergoes reverse intersystem crossing from the excited triplet state to an excited singlet state. Consequently, using a perovskite-type compound as a host material in a light-emitting layer, the most material can efficiently form singlet excitons and the excited singlet state energy is utilized for light emission of an organic light-emitting device to provide a higher light emission efficiency.

Further, a perovskite-type compound can be synthesized according to a simple method as compared with a host material of an organic compound, and is therefore inexpensive. Consequently, using a perovskite-type compound as a host material in a light-emitting layer, the material cost for organic light-emitting devices can be reduced.

In addition, a perovskite-type compound gives a different absorption/emission spectrum depending on the kind thereof, and therefore, by selecting a suitable kind thereof, a perovskite-type compound can be used as a host material having absorption/emission in a desired wavelength region, and as having a high transparency, another advantage of a perovskite-type compound is that its risk to lower light emission from a light-emitting material to be combined with the compound is low, that is, a perovskite-type compound has a high applicability as a host material.

In addition, in the present invention, a perovskite-type compound is used as a host material but not as a light-emitting material, and therefore still another advantage of the invention in that the operation of an organic light-emitting device in continuous driving can be stabilized. This may be considered to be because of the following reasons.

Specifically, in the case where a perovskite-type compound is used as a light-emitting material, different from the present invention, there is seen a phenomenon that the emission intensity in continuous driving rapidly lowers. This is presumed to be because in a high electric field, a perovskite-type compound may be in an unstable excited state. As opposed to this, in the present invention, a perovskite-type compound is used as a host material, and therefore when a perovskite-type compound has turned to an unstable excited state, the excitation energy thereof transfers to a light-emitting material and the unstable excited state of the perovskite-type compound can be immediately solved. Accordingly, it is presumed that the operational stability of the organic light-emitting device can be improved.

[Perovskite-Type Compound]

The perovskite-type compound that the host material in the present invention contains is an ionic compound composed of an organic cation, a divalent metal ion, and a halide ion, and can form a perovskite-type crystal structure. The perovskite-type compound for use in the present invention may be a three-dimensional perovskite in which the constituent ions are regularly arranged in three-dimensional directions to form a perovskite-type structure, or may be a two-dimensional perovskite that forms a layered structure in which inorganic layers made of two-dimensionally arranged inorganic frameworks each corresponding to the octahedral portion in a perovskite-type structure, and organic layers formed of oriented organic cations are alternately layered. The perovskite-type compound includes compounds represented by the following general formulae (1) to (4). Among these, compounds represented by the general formulae (1) to (3) are compounds capable of forming a two-dimensional perovskite structure, and compounds represented by the general formula (4) are compounds capable of forming a three-dimensional perovskite structure.

(Compound Represented by General Formula (1))

$$A_2BX_4 \quad (1)$$

In the general formula (1), A represents an organic cation, B represents a divalent metal ion, and X represents a halide ion. The two instances of A, or the four instances of X, may be the same as each other or not.

The compound represented by the general formula (1) can form a layered structure composed of, as alternately layered, an inorganic layer of two-dimensionally arranged inorganic skeletons $BX_4$ corresponding to the octahedral portion of a perovskite-type structure, and an organic layer of two-dimensionally arranged oriented organic cations $A_2$. Here, the inorganic skeleton $BX_4$ has a structure where a divalent metal ion B is arranged in the center of an octahedron having a halide ion X at the corner thereof, and the neighboring octahedrons share the corner. The organic cation A is oriented with the cationic group facing the organic layer side. Four cationic groups above and below each octahedron are the corners of a cubic crystal system, and the corner of each octahedron is the face center of a cubic crystal system to constitute a perovskite-type structure.

The organic cation represented by A is preferably an ammonium represented by the general formula (5) below.

$$R_4N^+ \quad (5)$$

In the general formula (5), R represents a hydrogen atom or a substituent, wherein at least one of the four instances of R is a substituent with a carbon number of 2 or more. Among the four instances of R, the number of substituents with a carbon number of 2 or more is preferably 1 or 2, more preferably 1. Also, in the four instances of R that constitute the ammonium, preferably one of them is a substituent with a carbon number of 2 or more, and the rest are hydrogen atoms. When two or more instances of R are substituents, these substituents may be the same as each other or not. The substituent with a carbon number of 2 or more or any other substituent is not particularly limited, but can be an alkyl group, an aryl group, a heteroaryl group, or the like, wherein such a substituent can be further substituted with an alkyl group, an aryl group, a heteroaryl group, halogen, or the like. The number of carbons in the substituent with a carbon number of 2 or more as an alkyl group is preferably 2 to 30, more preferably 2 to 10, further preferably 2 to 5. In an aryl group, it is preferably 6 to 20, more preferably 6 to 18, further preferably 8 to 10. In a heteroaryl group, it is preferably 5 to 19, more preferably 5 to 17, further preferably 7 to 9. A heteroatom in the heteroaryl group can be a nitrogen atom, an oxygen atom, a sulfur atom, or the like. The thickness of the organic layer will depend on the length of the substituent represented by R (e.g., the chain length of the alkyl group), whereby the characteristics of the functional layer formed from this compound can be controlled.

Preferably, the organic cation represented by A has at least one of an alkylene group and an aromatic ring, preferably both of the alkylene group and the aromatic ring, more preferably a structure formed by joining the alkylene group to the aromatic ring, further preferably an ammonium represented by the general formula (5a) below.

$$Ar(CH_2)_{n1}NH_3^+ \quad (5a)$$

In the general formula (5a), Ar represents an aromatic ring. n1 is an integer from 1 to 20.

The aromatic ring in the organic cation may be an aromatic hydrocarbon or an aromatic heterocycle, and is preferably an aromatic hydrocarbon. A heteroatom in the aromatic heterocycle can be a nitrogen atom, an oxygen atom, a sulfur atom, or the like. The aromatic hydrocarbon is: preferably a benzene ring, or a fused polycyclic hydrocarbon that has a structure with more than one benzene ring fused; preferably a benzene ring, naphthalene ring, phenanthrene ring, anthracene ring, chrysene ring, tetracene ring, or perylene ring, preferably a benzene ring or naphthalene ring; further preferably a benzene ring. The aromatic heterocycle is: preferably a pyridine ring, pyrazine ring, pyrimidine ring, pyridazine ring, pyrrole ring, thiophene ring, furan ring, carbazole ring, or triazine ring; more preferably, a pyridine ring, pyrazine ring, pyrimidine ring, or pyridazine ring; further preferably, a pyridine ring. The aromatic ring in the organic cation may have a substituent such as an alkyl group, an aryl group, or a halogen atom (preferably a fluorine atom), wherein a hydrogen atom in the aromatic ring or in the substituent bond to the aromatic ring may be a heavy hydrogen atom.

In the general formula (5a), n1 is an integer from 1 to 20, preferably an integer from 2 to 10.

Besides an ammonium, the organic cation represented by A can be formamidinium, cesium, or the like.

The divalent metal ion represented by B can be $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Eu^{2+}$, or the like, and is preferably $Sn^{2+}$ or $Pb^{2+}$, more preferably $Sn^{2+}$.

The halide ion represented by X can be a fluoride, chloride, bromide, or iodide ion. The halide ions represented by three instances of X may be the same as each other, or may be a combination of 2 or 3 different halide ions. Preferably, the three instances of X are the same halide ion. More preferably, the three instances of X are each an iodide ion.

Specific preferred examples of the perovskite-type compound represented by the general formula (1) include: tin-based perovskites such as $[CH_3(CH_2)_{n2}NH_3)]_2SnI_4$ (n2=2 to 17), $(C_4H_9C_2H_4NH_3)_2SnI_4$, $(CH_3(CH_2)_{n3}(CH_3)CHNH_3)_2SnI_4$ [n3=5 to 8], $(C_6H_5C_2H_4NH_3)_2SnI_4$, $(C_{10}H_7CH_2NH_3)_2SnI_4$, and $(C_6H_5C_2H_4NH_3)_2SnBr_4$; and lead-based perovskites such as $[CH_3(CH_2)_{n2}NH_3)]_2PbI_4$ (n2=2 to 17), $(C_4H_9C_2H_4NH_3)_2PbI_4$, $(CH_3(CH_2)_{n3}(CH_3)CHNH_3)_2PbI_4$ [n3=5 to 8], $(C_6H_5C_2H_4NH_3)_2PbI_4$, $(C_{10}H_7CH_2NH_3)_2PbI_4$, and $(C_6H_5C_2H_4NH_3)_2PbBr_4$. However, perovskite-type compounds that may be used in the present invention are not limited to these compounds.

(Compound Represented by General Formula (2))

$$A^2{}_2A^1{}_{n-1}B_nX_{3n-1} \qquad (2)$$

In the general formula (2), $A^2$ represents an organic cation with a carbon number greater than that of $A^1$. In the general formula (2), B and X are as defined for the general formula (1), and $A^2$ in the general formula (2) is as defined for the general formula (1). For the preferred range and specific examples of $A^2$, B, and X in the general formula (2), one can refer to the preferred range and specific examples of A, B, and X in the general formula (1). Here, the two instances of $A^2$, or the plural instances of X, may be the same as each other or not. When plural instances of $A^1$ or B are present, the plural instances of $A^1$ or B may be the same as each other or not.

The organic cation represented by $A^1$ is an organic cation with a carbon number smaller than that of $A^2$, preferably an ammonium represented by the general formula (6) below.

$$R^{11}{}_4N^+ \qquad (6)$$

In the general formula (6), $R^{11}$ represents a hydrogen atom or a substituent, and at least one of the four instances of $R_{11}$ is a substituent. The number of substituents among the four instances of $R^{11}$ is preferably one or two, more preferably one. That is, among the four instances of $R^{11}$ that constitute the ammonium, preferably one is a substituent and the rest are hydrogen atoms. When two or more instances of $R^{11}$ are substituents, these substituents may be the same as each other or not. The substituents are not particularly limited, but include an alkyl group and an aryl group (phenyl group, naphthyl group, and the like), wherein each substituent may be further substituted with an alkyl group, an aryl group, or the like. The number of carbons in the substituent as an alkyl group is preferably 1 to 30, more preferably 1 to 20, further preferably 1 to 10. In an aryl group, it is preferably 6 to 30, more preferably 6 to 20, further preferably 6 to 10.

Besides an ammonium, the organic cation represented by $A^1$ or $A^2$ can be formamidinium, cesium, or the like.

The compound represented by the general formula (2) forms a layered structure in which inorganic layers formed from octahedral inorganic skeletons $B_nX_{3n+1}$ and organic layers formed from organic cations $A^2$ are alternately layered. n corresponds to the number of layered octahedra per inorganic layer, and is an integer from 1 to 100. When n is 2 or more, organic cations $A^1$ are positioned between the layered octahedra at the corners of the cubic crystal system.

Specific preferred examples of the organic-inorganic perovskite-type compound represented by the general formula (2) include a compound represented by the general formula (2a) below.

$$(C_4H_9NH_3)_2(CH_3NH_3)_{n-1}Sn_nI_{3n+1} \qquad (2a)$$

In the general formula (2a), n is an integer from 1 to 100, preferably an integer from 1 to 5. Specifically, it can be $(C_4H_9NH_3)_2SnI_4$, $(C_4H_9NH_3)_2(CH_3NH_3)Sn_2I_7$, $(C_4H_9NH_3)_2(CH_3NH_3)_2Sn_3I_{10}$, $(C_4H_9NH_3)_2(CH_3NH_3)_3Sn_4I_{13}$, or $(C_4H_9NH_3)_2(CH_3NH_3)_4Sn_5I_{16}$. Also, specific preferred examples of the organic-inorganic perovskite-type compound represented by the general formula (2) include: $(CH_3(CH_2)_nNH_3)_2PbI_4$ (n=2 to 17), $(C_4H_9C_2H_4NH_3)_2PbI_4$, $(CH_3(CH_2)_n(CH_3)CHNH_3)_2PbI_4$ [n=5 to 8], $(C_6H_5C_2H_4NH_3)_2PbI_4$, $(C_{10}H_7CH_2NH_3)_2PbI_4$, $(C_6H_5C_2H_4NH_3)_2PbBr_4$, and the like. However, perovskite-type compounds that may be used in the present invention are not limited to these compounds.

(Compound Represented by General Formula (3))

$$A^2{}_2A^1{}_mB_mX_{3m+2} \qquad (3)$$

In the general formula (3), $A^2$ represents an organic cation with a carbon number greater than that of $A^1$. In the general formula (3), B and X are as defined for the general formula (1). For the preferred range and specific examples of B and X in the general formula (3), one can refer to the preferred range and specific examples of B and X in the general formula (1), respectively. In the general formula (3), $A^1$ is as defined for the general formula (2). For the preferred range and specific examples of $A^1$ in the general formula (3), one can refer to the preferred range and specific examples of $A^1$ in the general formula (2).

The two instances of $A^2$, or the plural instances of X, may be the same as each other or not. When plural instances of $A^1$ or B are present, the plural instances of $A^1$ or B may be the same as each other or not.

The compound represented by the general formula (3) forms a layered structure in which inorganic layers formed from inorganic skeletons $B_mX_{3m+2}$ and organic layers formed from organic cations $A^2$ are alternately layered. m corresponds to the number of layered inorganic skeletons per inorganic layer, and is an integer from 1 to 100.

The organic cation represented by $A^2$ is an organic cation with a carbon number greater than that of $A^1$, preferably an ammonium represented by the general formula (6) above, more preferably an ammonium represented by the general formula (7) below.

$$(R^{12}{}_2C=NR^{13}{}_2)^+ \qquad (7)$$

In the general formula (7), $R^{12}$ and $R^{13}$ each independently represent a hydrogen atom or a substituent, wherein one instance of $R^{12}$ may be the same as another one or not, and one instance of $R^{13}$ may be the same as another one or not. The substituents are not particularly limited, but include an alkyl group, an aryl group, an amino group, a halogen atom, and the like, wherein the alkyl group, the aryl group, or the amino group can be further substituted with an alkyl group, an aryl group, an amino group, a halogen atom, or the like. The number of carbons in the substituent as an alkyl group is preferably 1 to 30, more preferably 1 to 20, further preferably 1 to 10. In an aryl group, it is preferably 6 to 30, more preferably 6 to 20, further preferably 6 to 10. The thickness of the organic layer will depend on the length of the substituent represented by $R^{12}$ (e.g., the chain length of the alkyl group), whereby the characteristics of the functional layer formed from this mixture can be controlled. To make a combination of $R^{12}$ and $R^{13}$, an amino group or a halogen atom as $R^{12}$ and a hydrogen atom or an alkyl group as $R^{13}$ can be employed in combination, for example. Alternatively, an amino group or a halogen atom as $R^{12}$ and a hydrogen atom as $R^{13}$ can be employed in combination.

Besides an ammonium, the organic cation represented by $A^2$ can be formamidinium, cesium, or the like.

Specific preferred examples of the organic-inorganic perovskite-type compound represented by the general formula (3) include a compound represented by the general formula (3a) below.

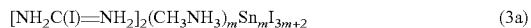

$$[NH_2C(I)=NH_2]_2(CH_3NH_3)_mSn_mI_{3m+2} \quad (3a)$$

In the general formula (3a), m is an integer from 2 to 100, preferably an integer from 2 to 5. Specifically, it can be $[NH_2C(I)=NH_2]_2(CH_3NH_3)_2Sn_2I_8$, $[NH_2C(I)=NH_2]_2(CH_3NH_3)_3Sn_3I_{11}$, or $[NH_2C(I)=NH_2]_2(CH_3NH)_4Sn_4I_{14}$. However, the perovskite-type compounds that may be used in the present invention are not limited to these compounds.

The total number of the inorganic layers and the organic layers formed of the compound of the general formulae (1) to (3) is preferably 1 to 100, more preferably 1 to 50, even more preferably 5 to 20.

(Compound Represented by General Formula (4))

$$A^3BX_3 \quad (4)$$

In the general formula (4), $A^3$ represents an organic cation. B and X in the general formula (4) each have the same meanings as those of B and X in the general formula (1). For preferred ranges and specific examples of B and X in the general formula (4), reference may be made to the preferred ranges and the specific examples of B and X in the general formula (1). B in the compound represented by the general formula (4) is preferably a fluoride ion, and also preferably a combination of an iodide ion and a fluoride ion. For preferred ranges and specific examples of $A^3$ in the general formula (4), reference may be made to the preferred ranges and the specific examples of $A^1$ in the general formula (2). Three X's may be the same as or different from each other.

The compound represented by the general formula (4) forms a cubic perovskite structure having a unit lattice of a cubic crystal system, in which the organic cation A is positioned at each corner of the cubic crystal, the metal ion B is positioned at the body center thereof, and the halide ion X is positioned at each face center thereof. Here, the inorganic skeleton of the metal ion B and the halide ion X forms an octahedron.

Preferred examples of the perovskite-type compound represented by the general formula (4) include $CH_3NH_3PbI_3$, $CH_3NH_3PbCl_3$, $CH_3NH_3PbBr_3$, $CH_3NH_3SnI_3$, $CH_3NH_3SnI_qF_{3-q}$ (where q is an integer of 0 to 2), $CH_3NH_3SnCl_3$, $CH_3NH_3SnBr_3$, $(NH_2)_2CHSnI_3$. $CH_3NH_3PbI_3$, $CH_3NH_3SnI_qF_{3-q}$, and $(NH_2)_2CHSnI_3$ are preferred. However, the perovskite-type compounds for use in the present invention are not limitatively interpreted by these compounds.

Among the above-mentioned perovskite-type compounds, preferred are those containing at least one of $Sn^{2+}$ and $Pb^{2+}$ as a divalent metal ion, those containing at least one of methylammonium, formamidinium and cesium as an organic cation, and those containing at least one of $Cl^-$, $I^-$, and $F^-$ as a halide ion. Among the compounds represented by the general formula (1) to the general formula (4), the compounds represented by the general formula (4) are preferred, $CH_3NH_3PbCl_3$, and $CH_3NH_3SnI_3$, are more preferred, and $CH_3NH_3PbCl_3$ is most preferred.

One kind alone or two or more kinds of the perovskite-type compounds may be used either singly or as combined. A preferred combination is a combination of two or more of $CH_3NH_3SnI_3$, and $CH_3NH_3SnI_qF_{3-q}$ (where q is an integer of 0 to 2).

[Carrier Mobility Through Perovskite-Type Compound]

The carrier mobility through the perovskite-type compound that the host material of the present invention contains is preferably $10^{-2}$ to $10^3$ $cm^2V^{-1}s^{-1}$, more preferably 10–1 to $10^2$ $cm^2V^{-1}s^{-1}$, even more preferably $10^{-1}$ to $10^2$ $cm^2V^{-1}s^{-1}$. With that, reduction in the drive voltage of an organic light-emitting device and improvement in the light emission efficiency thereof can be secured.

The carrier mobility through the perovskite-type compound can be determined according to the method mentioned below.

First, a laminate is prepared by layering a glass substrate, an anode of indium tin oxide (ITO) having a thickness of 100 nm and a film of molybdenum oxide ($MoO_x$) having a thickness of 10 nm in that order, and on the film of molybdenum oxide of the laminate, formed is a film of a perovskite-type compound to be determined in point of carrier mobility therethrough, in a thickness of 1000 to 5000 nm. On the film of the perovskite-type compound, layered are a film of molybdenum oxide having a thickness of 10 nm and a cathode of aluminium having a thickness of 100 nm in that order to produce a hole transport device.

An electron transport device is produced according to the same process as that for the hole transport device except that, in place of the film of molybdenum oxide, a film of cesium having a thickness of 0.5 nm is formed between the node and the perovskite-type compound film and between the perovskite-type compound film and the cathode.

The produced hole transport device and the electron transport device are driven to measure the current density-voltage characteristic thereof on a double logarithmic chart, and from the current density and the voltage read on the chart and according to the space-charge-limited current equation shown below, the hole mobility pi and the electron mobility $\mu_e$ through the perovskite layer are determined.

$$J = \frac{9}{8}\varepsilon_r\varepsilon_0, u\frac{V^2}{L^3}$$

In the equation, J represents a current density, $\varepsilon_r$ represents a dielectric constant of the compound, $\varepsilon_0$ represents a dielectric constant in vacuum, $\mu$ represents a carrier mobility, L represents a thickness of the perovskite layer, V represents an applied voltage. For the dielectric constant $\varepsilon_r$, a literature value 23.9 is used. For the details of the hole mobility $\mu_h$ and the electron mobility $\mu_e$, reference may be made to M. A. Lampert, P. Mark, Current injection in solids Academic, New York, 1970.

Here, the carrier mobility $\mu$ calculated using the current density and the applied voltage measured with the hole transport device is referred to as a hole mobility $\mu_h$, and the carrier mobility $\mu$ calculated using the current density and the applied voltage measured with the electron transport device is referred to as an electron mobility $\mu_e$.

[Photoabsorption Characteristic of Perovskite-Type Compound]

The perovskite-type compound that the host material of the present invention contains preferably does not have a maximum absorption wavelength at 200 to 750 nm in the emission wavelength range of the light-emitting material to be combined with the host material, more preferably does not have a maximum absorption wavelength at 200 to 2000 nm. With that, the light takeoff efficiency from the organic light-emitting device can be high. Here, the emission wavelength range of a light-emitting material is a wavelength region within a range of $\lambda_{max} \pm 100$ nm, wherein $\lambda_{max}$ means a maximum emission wavelength of the light-emitting material existing in a visible light region of 380 to 750 nm.

<Film>

Next, the film of the present invention is described.

The film of the present invention contains a perovskite-type compound and an organic light-emitting material. The film can be effectively used as a light-emitting layer of an organic light-emitting device.

Regarding the explanation and the preferred range and specific examples of the perovskite-type compound, reference may be made to the description relating to the perovskite-type compound that the host material mentioned above contains.

Regarding the kind and specific examples of the organic light-emitting material that can be used in the film, and the content of the organic light-emitting material, reference may be made to the description relating to the organic light-emitting material for use in the light-emitting layer of the organic light-emitting device to be mentioned hereinunder.

The film of the present invention is preferably such that the inclination of the single logarithmic chart thereof where the common logarithm of the excitation light intensity is on the horizontal axis and the photoluminescence quantum yield is on the vertical axis is positive. A film of the type is considered to hardly cause exciton-exciton annihilation even in the case where excitons are formed in a density by high energy supply, in which, therefore, excitation energy of excitons can be efficiently utilized for light emission.

[Method for Film Formation]

A method for forming the film of the present invention is not specifically limited, and the layer may be formed according to a dry process such as a vacuum evaporation method, or a wet process such as a solution coating method. Here, when a solution coating method is employed, the layer can be formed using a simple apparatus within a short period of time, and is therefore advantageous in point of cost reduction for industrial scale mass-production. When a vacuum evaporation method is employed, its advantage is that a film having a better surface condition can be formed.

For example, for forming a film that contains a perovskite-type compound $A^3BX_3$ and an organic light-emitting material according to a vacuum evaporation method, employable is a co-evaporation method of co-evaporating a compound $A^3X$ of an organic cation and a halide ion, a metal halide compound $BX_2$ and an organic light-emitting material from different evaporation sources. A film containing any other perovskite-type compound represented by the above-mentioned general formulae than the compound and an organic light-emitting material can also be formed by co-evaporating a compound of an organic cation and a halide ion, a metal halide compound and an organic light-emitting material according to this method.

For forming a perovskite layer of a perovskite-type compound $A^3BX_3$ according to a solution coating method, a compound $A^3X$ of an organic cation and a halide ion, and a metal halide compound $BX_2$ are reacted in a solution to synthesize a perovskite-type compound, then a coating liquid containing the perovskite-type compound and an organic light-emitting material is applied onto the surface of a support, and drying it to form a film thereon. A film containing any other perovskite-type compound represented by the above-mentioned general formulae than the compound and an organic light-emitting material can also be formed according to this method by synthesizing a perovskite-type compound and applying a coating liquid that contains the perovskite-type compound and an organic light-emitting material onto the surface of a support and drying it to form a film thereon.

A coating method with a coating liquid is not specifically limited, and any conventionally-known coating method such as a gravure coating method, a bar coating method, a printing method, a spraying method, a spin coating method, a dipping method or a die coating method may be used. Since a relatively thin coating film can be formed uniformly, a spin coating method is preferred.

The solvent for the coating liquid is not particularly limited as long as it can dissolve the perovskite-type compound. Specifically, it can be an ester (methyl formate, ethyl formate, propyl formate, pentyl formate, methyl acetate, ethyl acetate, pentyl acetate, or the like), a ketone (γ-butyrolactone, N-methyl-2-pyrrolidone, acetone, dimethyl ketone, diisobutyl ketone, cyclopentanone, cyclohexanone, methyl cyclohexanone, or the like), an ether (diethyl ether, methyl-tert-butyl ether, diisopropyl ether, dimethoxymethane, dimethoxyethane, 1,4-dioxane, 1,3-dioxolan, 4-methyldioxolan, tetrahydrofuran, methyl tetrahydrofuran, anisole, phenetole, or the like), an alcohol (methanol, ethanol, 1-propanol, 2-propanol, 1-butanol, 2-butanol, tert-butanol, 1-pentanol, 2-methyl-2-butanol, methoxypropanol, diacetone alcohol, cyclohexanol, 2-fluoroethanol, 2,2,2-trifluoroethanol, 2,2,3,3-tetrafluoro-1-propanol, or the like), a glycol ether (cellosolve) (ethylene glycol monomethyl ether, ethylene glycol monoethyl ether, ethylene glycol monobutyl ether, ethylene glycol monoethyl ether acetate, triethylene glycol dimethyl ether, or the like), an amide solvent (N,N-dimethyl formamide, acetamide, N,N-dimethyl acetamide, or the like), a nitrile solvent (acetonitrile, isobutyronitrile, propionitrile, methoxyacetonitrile, or the like), a carbonate agent (ethylene carbonate, propylene carbonate, or the like), a halogenated hydrocarbon (methylene chloride, dichloromethane, chloroform, or the like), a hydrocarbon (n-pentane, cyclohexane, n-hexane, benzene, toluene, xylene, or the like), dimethyl sulfoxide, or the like. It can also have two or more of ester, ketone, ether, and alcohol functional groups (i.e., —O—, —CO—, —COO—, —OH), or it can be an ester, a ketone, an ether, or an alcohol in which a hydrogen atom in the hydrocarbon portion is replaced by a halogen atom (particularly a fluorine atom).

The amount of the perovskite-type compound contained in the coating liquid is preferably 1 to 50% by mass based on the entire coating liquid, more preferably 2 to 30% by mass, further preferably 5 to 20% by mass. The content of the organic light-emitting material in the coating liquid is preferably 0.001% by mass or more and less than 50% by mass based on the total amount of the perovskite-type compound and the organic light-emitting material therein.

Preferably, the coating liquid on the support surface is dried by air-drying or heat drying in an atmosphere purged with an inert gas such as nitrogen.

<Organic Light-Emitting Device>

Next described is the organic light-emitting device of the present invention.

The organic light-emitting device of the present invention has a light-emitting layer that contains a perovskite-type compound and an organic light-emitting material.

As described above, a perovskite-type compound has a high carrier mobility and therefore, when a light-emitting layer contains a perovskite-type compound, the drive voltage of the organic light-emitting device having such a light-emitting layer can be reduced and the light emission efficiency thereof can be enhanced. In addition, a perovskite-type compound readily undergoes reverse intersystem crossing from an excited triplet state to an excited singlet state and can efficiently form singlet excitons. Accordingly, when a light-emitting layer contains a perovskite-type compound and an organic light-emitting material, excited singlet energy can be efficiently supplied to the organic light-emitting material and can be utilized for light emission to achieve a higher light emission efficiency. Further, the excited energy of the perovskite-type compound is supplied to the organic light-emitting material, and therefore even when the perovskite-type compound becomes an unstable excited state, the excited state can be immediately solved. Accordingly, the organic light-emitting device of the invention has another advantage that the operation thereof can be stabilized.

Moreover, a perovskite-type compound is inexpensive and therefore, when the compound is used as a material in a light-emitting layer, the material cost of the resultant organic light-emitting device can be reduced.

[Layer Configuration of Organic Light-Emitting Device]

The organic light-emitting device to which the present invention applies may be an organic photoluminescent device (organic PL device) or an organic electroluminescent device (organic EL device). An organic photoluminescent device has a configuration with at least a light-emitting layer formed on a substrate, and in addition to the perovskite layer, preferably has at least one light-emitting layer. An organic electroluminescent device has a configuration having at least an anode and a cathode, and an organic layer formed between the anode and the cathode, in which the organic layer contains at least a light-emitting layer. When applied especially to an organic electroluminescent device among these organic light-emitting devices, the present invention attains an effect of markedly improving the light emission efficiency of the device as compared with any other already-existing device configurations. This is because of the following reasons.

Specifically, in an organic electroluminescent device, carriers are injected from an anode and a cathode into a light-emitting layer and are recombined therein, and in the light-emitting layer, singlet excitons and triplet excitons are formed at a probability of 25%:75%. At this time, a perovskite-type compound readily undergoes reverse intersystem crossing, and therefore in a zone composed of a perovskite-type compound of a carrier recombination zone of a light-emitting layer, the triplet excitons formed at a probability of 75% efficiently convert to singlet excitons and, as a result, singlet excitons are to form at a far higher ratio than 25%. Consequently, as compared with a case of using an already-existing host material, excited singlet energy can be transferred efficiently to an organic light-emitting material and used for light emission, and therefore the light emission efficiency of the resultant organic light-emitting device can be markedly improved.

As described above, an organic electroluminescent device has a configuration of at least an anode, a cathode and an organic layer formed between the anode and the cathode. The organic layer contains at least a light-emitting layer, and may be formed of a light-emitting layer alone, or the device may have one or more other organic layers in addition to a light-emitting layer. Such other organic layers include a hole transport layer, a hole injection layer, an electron blocking layer, a hole blocking layer, an electron injection layer, an electron transport layer and an exciton blocking layer. The hole transport layer may be a hole injection and transport layer having a hole injection function, and the electron transport layer may be an electron injection and transport layer having an electron injection function. A configuration example of a typical organic electroluminescent device is shown in FIG. 1. In FIG. 1, 1 is a substrate, 2 is an anode, 3 is a hole injection layer, 4 is a hole transport layer, 5 is a light-emitting layer, 6 is an electron transport layer, and 7 is a cathode.

In the following, the constituent members and the layers of the organic electroluminescent device are described. The description of the substrate and the light-emitting layer given below may apply to the substrate and the light-emitting layer of an organic photoluminescent device.

(Substrate)

The organic electroluminescent device of the invention is preferably supported by a substrate. The substrate is not particularly limited and may be those that have been commonly used in an organic electroluminescent device, and examples thereof used include those formed of glass, transparent plastics, quartz and silicon.

(Anode)

The anode of the organic electroluminescent device used is preferably formed of an electrode material, such as a metal, an alloy, or an electroconductive compound each having a large work function (4 eV or more), or a mixture thereof. Specific examples of the electrode material include a metal, such as Au, and an electroconductive transparent material, such as CuI, indium tin oxide (ITO), $SnO_2$ and ZnO. A material that is amorphous and is capable of forming a transparent electroconductive film, such as IDIXO ($In_2O_3$—ZnO), may also be used. The anode may be formed in such a manner that the electrode material is formed into a thin film by such a method as vapor deposition or sputtering, and the film is patterned into a desired pattern by a photolithography method, or in the case where the pattern may not require high accuracy (for example, approximately 100 μm or more), the pattern may be formed with a mask having a desired shape on vapor deposition or sputtering of the electrode material. In alternative, in the case where a material capable of being coated, such as an organic electroconductive compound, is used, a wet film forming method, such as a printing method and a coating method, may be used. In the case where emitted light is to be taken out through the anode, the anode preferably has a transmittance of more than 10%, and the anode preferably has a sheet resistance of several hundred ohm per square or less. The thickness of the anode may be generally selected from a range of from 10 to 1,000 nm, and preferably from 10 to 200 nm, while depending on the material used.

(Cathode)

The cathode is preferably formed of as an electrode material such as a metal (which is referred to as an electron injection metal), an alloy, or an electroconductive compound, having a small work function (4 eV or less), or a mixture thereof. Specific examples of the electrode material include sodium, a sodium-potassium alloy, magnesium, lithium, a magnesium-cupper mixture, a magnesium-silver mixture, a magnesium-aluminum mixture, a magnesium-indium mixture, an aluminum-aluminum oxide ($Al_2O_3$) mixture, indium, a lithium-aluminum mixture, and a rare earth metal. Among these, a mixture of an electron injection metal and a second metal that is a stable metal having a larger work function than the electron injection metal, for example, a magnesium-silver mixture, a magnesium-aluminum mixture, a magnesium-indium mixture, an aluminum-aluminum oxide ($Al_2O_3$) mixture, a lithium-aluminum mixture, and aluminum, is preferred from the standpoint of the electron injection property and the durability against oxidation and the like. The cathode may be produced by forming the electrode material into a thin film by such a method as vapor deposition or sputtering. The cathode preferably has a sheet resistance of several hundred ohm per square or less, and the thickness thereof may be generally selected from a range of from 10 nm to 5 μm, and preferably from 50 to 200 nm. For transmitting the emitted light, any one of the anode and the cathode of the organic electroluminescent device is preferably transparent or translucent, thereby enhancing the light emission luminance.

The cathode may be formed with the electroconductive transparent materials described for the anode, thereby forming a transparent or translucent cathode, and by applying the cathode, a device having an anode and a cathode, both of which have transmittance, may be produced.

(Light-Emitting Layer)

The light-emitting layer is a layer in which holes and electrons injected from an anode and a cathode are recombined to give excitons for light emission, and which contains at least a perovskite-type compound and an organic light-emitting material. The organic light-emitting material may be any of a fluorescent material, a delayed fluorescent material or a phosphorescent material, but is preferably a fluorescent material or a delayed fluorescent material, more preferably a fluorescent material. A fluorescent material undergoes radiative relaxation from an excited single state at a high probability and therefore can efficiently utilize the excited singlet energy that the material has received from a perovskite-type compound for light emission. Here, a delayed fluorescent material can give, when observed at 25° C., both fluorescence having a short emission lifetime and fluorescence having a long emission lifetime (delayed fluorescence), while a fluorescent material can give only fluorescence having a short emission lifetime but could not give fluorescence having a long emission lifetime (delayed fluorescence). Here, delayed fluorescence is fluorescence that is emitted when an excited singlet state having formed through reverse intersystem crossing from an excited triplet state is relaxed to a ground state, and is generally observed later than the fluorescence (ordinary fluorescence) from the excited singlet state directly formed through external energy donation or carrier recombination.

In order that the organic electroluminescent device and the organic photoluminescent device of the present invention can express a high light emission efficiency, it is important to confine the singlet exciton and the triplet exciton formed in an organic light-emitting material to the organic light-emitting material. Accordingly, the perovskite-type compound to be used in the light-emitting layer is preferably such that at least any one of the excited single energy and the excited triplet energy thereof is higher than that of the organic light-emitting material in the layer. As a result, the singlet excitons and the triplet excitons formed in the organic light-emitting material can be confined in the molecules of the organic light-emitting material to sufficiently derive the light emission efficiency thereof. In the organic light-emitting device or the organic electroluminescent device of the present invention, light emission occurs from the organic light-emitting material contained in the light-emitting layer. The light emission may be any of fluorescent emission, delayed fluorescent emission or phosphorescent emission, or may contain two or more types of such emissions. In addition, a part of light emission may be partially from the perovskite-type compound in the light-emitting layer.

The content of the organic light-emitting material in the light-emitting layer is preferably 0.001% by mass or more and less than 50% by mass relative to the total mass of the light-emitting layer. More preferably, the content of the organic light-emitting material in the light-emitting layer is 0.01% by mass or more relative to the total mass of the light-emitting layer, even more preferably 0.1% by mass or more, further more preferably 1% by mass or more, and may be 5% by mass or more Also more preferably, the content of the organic light-emitting material in the light-emitting layer is less than 40% by mass relative to the total mass of the light-emitting layer, even more preferably less than 30% by mass, further more preferably less than 20% by mass.

(Injection Layer)

The injection layer is a layer that is provided between the electrode and the organic layer, for decreasing the driving voltage and enhancing the light emission luminance, and includes a hole injection layer and an electron injection layer, which may be provided between the anode and the light-emitting layer or the hole transport layer and between the cathode and the light emitting layer or the electron transport layer. The injection layer may be provided depending on necessity.

(Blocking Layer)

The blocking layer is a layer that is capable of inhibiting charges (electrons or holes) and/or excitons present in the light-emitting layer from being diffused outside the light-emitting layer. The electron blocking layer may be disposed between the light-emitting layer and the hole transport layer, and inhibits electrons from passing through the light-emitting layer toward the hole transport layer. Similarly, the hole blocking layer may be disposed between the light-emitting layer and the electron transport layer, and inhibits holes from passing through the light-emitting layer toward the electron transport layer. The blocking layer may also be used for inhibiting excitons from being diffused outside the light-emitting layer. Thus, the electron blocking layer and the hole blocking layer each may also have a function as an exciton blocking layer. The term "the electron blocking layer" or "the exciton blocking layer" referred to herein is intended to include a layer that has both the functions of an electron blocking layer and an exciton blocking layer by one layer.

(Hole Blocking Layer)

The hole blocking layer has the function of an electron transport layer in a broad sense. The hole blocking layer has a function of inhibiting holes from reaching the electron transport layer while transporting electrons, and thereby enhances the recombination probability of electrons and holes in the light-emitting layer. As the material for the hole blocking layer, the material for the electron transport layer to be mentioned below may be used optionally.

(Electron Blocking Layer)

The electron blocking layer has the function of transporting holes in a broad sense. The electron blocking layer has a function of inhibiting electrons from reaching the hole transport layer while transporting holes, and thereby enhances the recombination probability of electrons and holes in the light-emitting layer.

(Exciton Blocking Layer)

The exciton blocking layer is a layer for inhibiting excitons generated through recombination of holes and electrons in the light-emitting layer from being diffused to the charge transporting layer, and the use of the layer inserted enables effective confinement of excitons in the light-emitting layer, and thereby enhances the light emission efficiency of the device. The exciton blocking layer may be inserted adjacent to the light-emitting layer on any of the side of the anode and the side of the cathode, and on both the sides. Specifically, in the case where the exciton blocking layer is present on the side of the anode, the layer may be inserted between the hole transport layer and the light-emitting layer and adjacent to the light-emitting layer, and in the case where the layer is inserted on the side of the cathode, the layer may be inserted between the light-emitting layer and the cathode and adjacent to the light-emitting layer. Between the anode and the exciton blocking layer that is adjacent to the light-emitting layer on the side of the anode, a hole injection layer, an electron blocking layer and the like may be provided, and between the cathode and the exciton blocking layer that is adjacent to the light-emitting layer on the side of the cathode, an electron injection layer, an electron transport layer, a hole blocking layer and the like may be provided. In the case where the blocking layer is provided, preferably, at least one of the excited singlet energy and the excited triplet energy of the material used as the blocking layer is higher than the excited singlet energy and the excited triplet energy of the light-emitting layer, respectively, of the light-emitting material.

(Hole Transport Layer)

The hole transport layer is formed of a hole transport material having a function of transporting holes, and the hole transport layer may be provided as a single layer or plural layers.

The hole transport material has one of injection or transporting property of holes and blocking property of electrons, and may be any of an organic material and an inorganic material. Examples of known hole transport materials that may be used herein include a triazole derivative, an oxadiazole derivative, an imidazole derivative, a carbazole derivative, an indolocarbazole derivative, a polyarylalkane derivative, a pyrazoline derivative, a pyrazolone derivative, a phenylenediamine derivative, an arylamine derivative, an amino-substituted chalcone derivative, an oxazole derivative, a styrylanthracene derivative, a fluorenone derivative, a hydrazone derivative, a stilbene derivative, a silazane derivative, an aniline copolymer and an electroconductive polymer oligomer, particularly a thiophene oligomer. Among these, a porphyrin compound, an aromatic tertiary amine compound and a styrylamine compound are preferably used, and an aromatic tertiary amine compound is more preferably used.

(Electron Transport Layer)

The electron transport layer is formed of a material having a function of transporting electrons, and the electron transport layer may be a single layer or may be formed of plural layers.

The electron transport material (often also acting as a hole blocking material) may have a function of transmitting the electrons injected from a cathode to a light-emitting layer. The electron transport layer usable here includes, for example, nitro-substituted fluorene derivatives, diphenylquinone derivatives, thiopyran dioxide derivatives, carbodiimides, fluorenylidenemethane derivatives, anthraquinodimethane and anthrone derivatives, oxadiazole derivatives, etc. Further, thiadiazole derivatives derived from the above-mentioned oxadiazole derivatives by substituting the oxygen atom in the oxadiazole ring with a sulfur atom, and quinoxaline derivatives having a quinoxaline ring known as an electron-attractive group are also usable as the electron transport material. Further, polymer materials prepared by introducing these materials into the polymer chain, or having these material in the polymer main chain are also usable.

The organic electroluminescent device may use a perovskite-type compound in any other layer than the light-emitting layer therein. For example, a perovskite-type compound may also be used in the above-mentioned hole transport layer or electron transport layer. In such a case, the perovskite-type compound used in the light-emitting layer may be the same as or different from the perovskite-type compound used in the other layer than the light-emitting layer.

In producing an organic electroluminescent device, each organic layer to constitute the organic electroluminescent device is sequentially formed on a substrate. A method for forming such layers is not specifically limited, and may be any of a dry process or a wet process. For the method for forming a light-emitting layer, reference may be made to the contents in the section of "Method for Film Formation" given hereinabove.

Preferred materials for use for the organic electroluminescent device are concretely exemplified below. However, the materials for use in the present invention are not limitatively interpreted by the following exemplary compounds. Compounds, even though exemplified as materials having a specific function, can also be used as other materials having any other function.

The organic light-emitting material for use in the light-emitting layer may be any light-emitting organic compound and is preferably any other organic light-emitting material than organic metal complexes, more preferably a coumarin skeleton-having light-emitting material. As the coumarin skeleton-having light-emitting material, Coumarin 153 used in Examples given hereinunder is preferred, and also preferred are derivatives having an electron-donating substituent at the 7-position of a coumarin ring. The light-emitting material having an amino group at the 7-position of a coumarin ring includes coumarin dyes such as 3-(2'-benzothiazolyl)-7-diethylaminocoumarin (Coumarin 6), 3-(2'-benzimidazolyl)-7-N,N-diethylaminocoumarin (Coumarin 7), 3-(2'-N-methylbenzimidazolyl)-7-N,N-diethylaminocoumarin (Coumarin 30) and 2,3,5,6-1H,4H-tetrahydro-8-trifluoromethylquinolidine(9,9a, 1-gh)coumarin (Coumarin 153), and other coumarin dyes such as Basic Yellow 51. The light-emitting material having a hydroxy group at the 7-position of a coumarin ring includes 7-hydroxycoumarin, 3-cyano-7-hydroxycoumarin, 7-hydroxy-4-methylcoumarin, 7-diethylamino-4-methylcoumarin, 7-diethylaminocyclopenta[c]-coumarin, 1,2,4,5,3H,6H,10H-tetrahydro-8-methyl[1]benzopyrano[9,9a, 1-gH]quinolidin-10-one, 7-amino-4-trifluoromethylcoumarin, 1,2,4,5,3H,6H,10H-tetrahydro-9-cyano[1]benzopyrano[9,9a,1-gH]quinolidin-10-one, 1,2,4,5,3H,6H, 10H-tetra-hydro-9-carbo-t-butoxy[1]benzopyrano[9,9a, 1-gH]quinolidin-10-one, 7-ethylamino-6-methyl-4-trifluoromethylcoumarin, 1,2,4,5, 3H,6H, 10H-tetrahydro-9-carboethoxy[1]benzopyrano[9, 9a, 1-gH]quinolidin-10-one, 7-diethylamino-3-(1-methyl-benzimidazolyl)coumarin, 7-dimethylamino-4-trifluoromethylcoumarin, 1,2,4,5,3H,6H, 10H-tetrahydro-9-carboxy[1]benzopyrano[9,9a, 1-gH]quinolidin-10-one, 1,2, 4,5,3H,6H, 10 OH-tetrahydro-9-acetyl[1]benzopyrano[9,9a,1-gH]quinolidin-10-one, 3-(2-benzimidazolyl)-7-N,N-diethylaminocoumarin, 1,2,4,5,3H,6H, 10H-tetra-hydro-8-trifluoromethyl[1]benzopyrano[9,9a, 1-gH]quinolidin-10-one, 3-(2-benzothiazolyl)-7-diethylaminocoumarin, 7-diethylaminocoumarin, 7-diethylamino-4-trifluoromethylcoumarin, 2,3,6,7-tetra-hydro-9-(trifluoromethyl)-11H,5H, 11H-[1]benzopyrano[6,7,8-ij]quinolidin-11-one, 7-amino-4-methylcoumarin, and 4,6-dimethyl-7-diethylaminocoumarin.

A delayed fluorescent material is also usable as the organic light-emitting material. Preferred examples of compounds usable as a delayed fluorescent material are shown below.

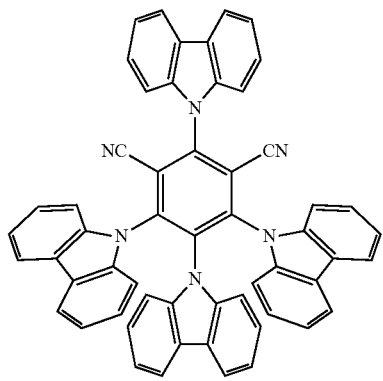

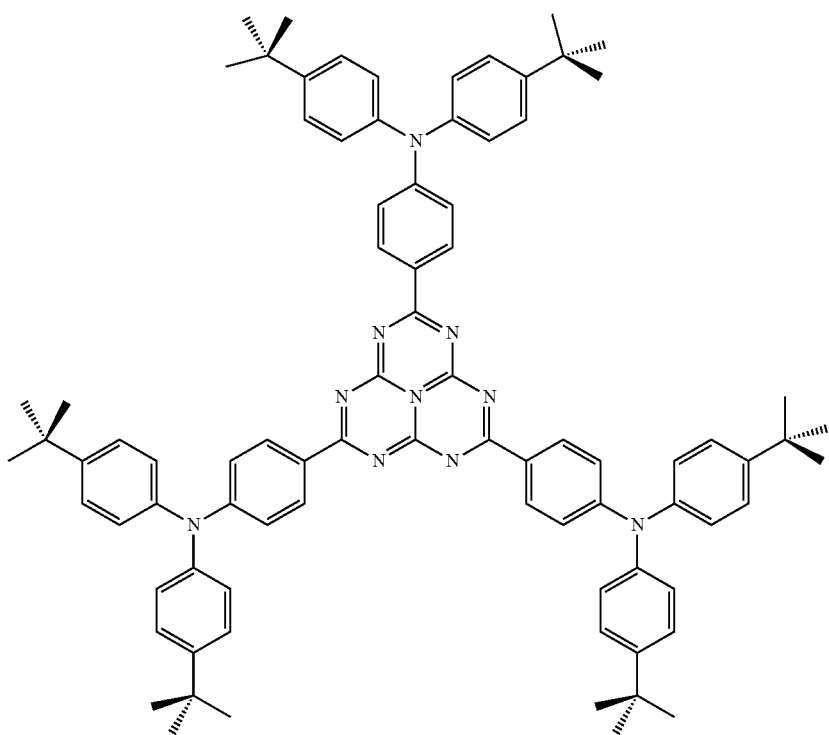

-continued
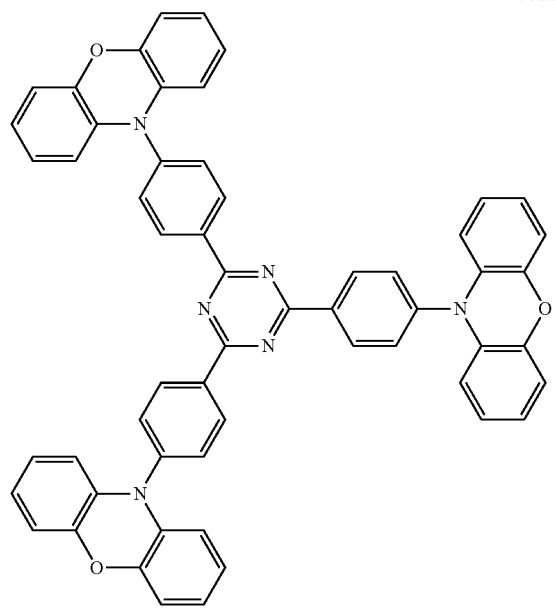
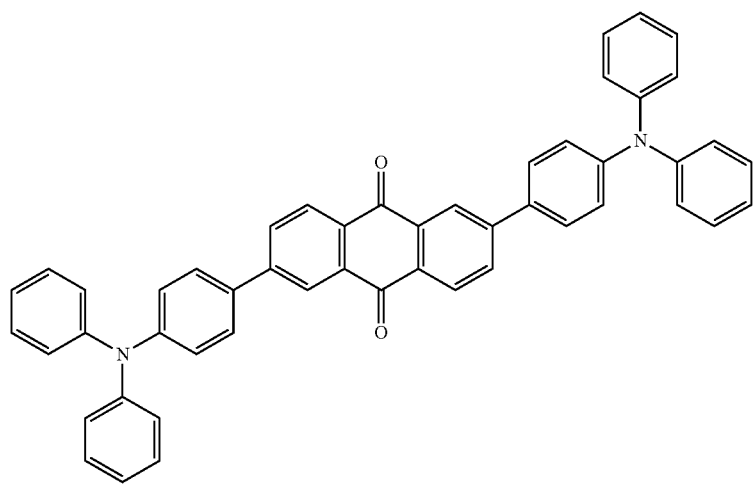
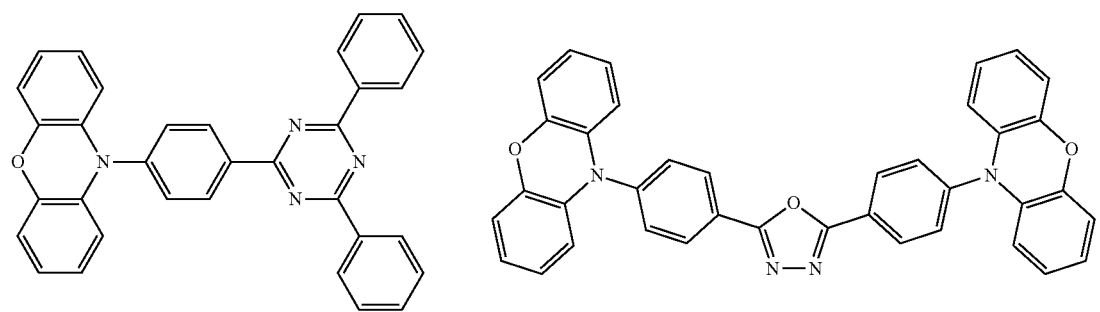

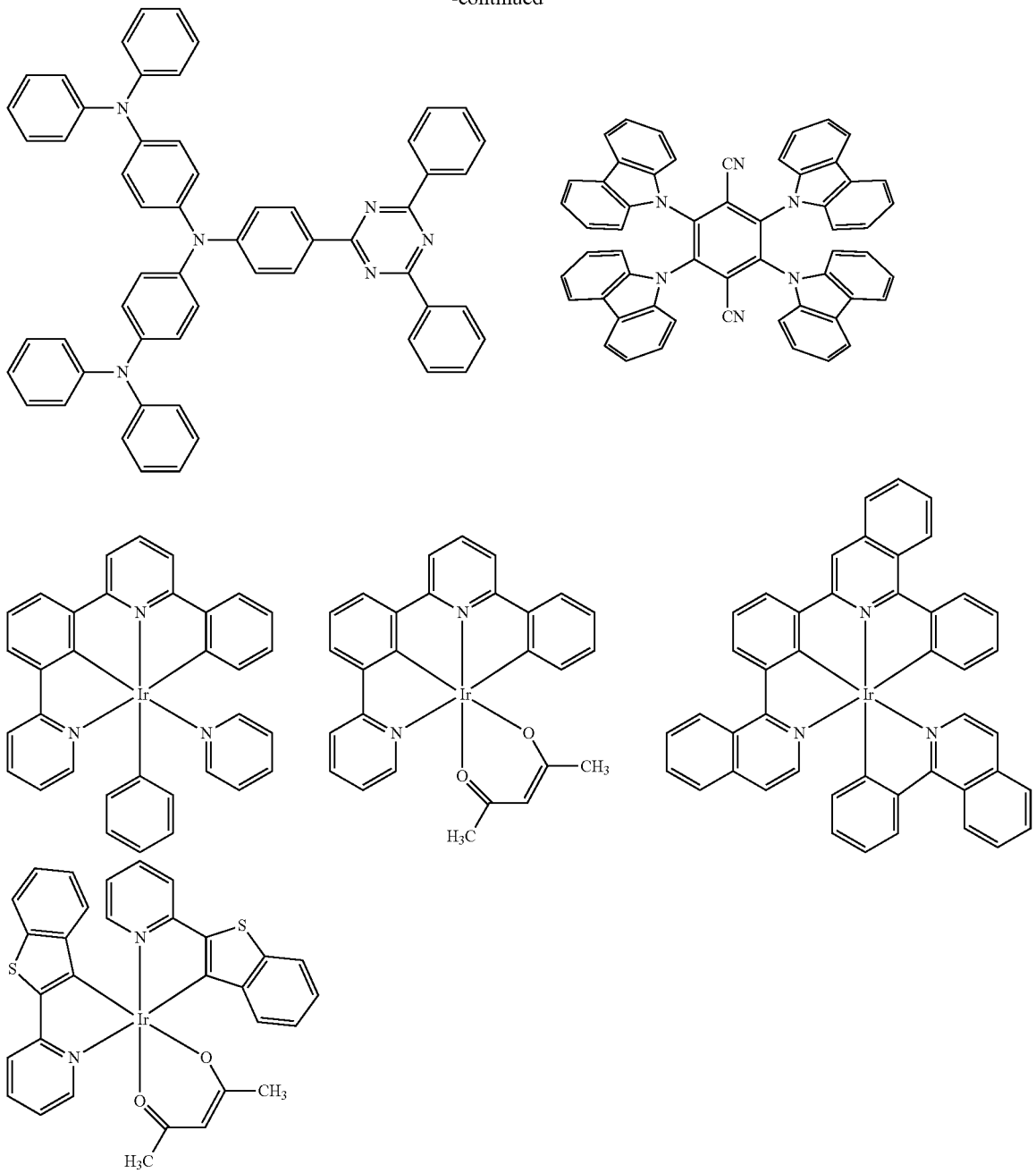

As preferred delayed fluorescent materials, also mentioned are compounds included in the general formulae, especially exemplary compounds capable of emitting delayed fluorescence described in WO2013/154064, paragraphs 0008 to 0048 and 0095 to 0133, WO2013/011954, paragraphs 0007 to 0047 and 0073 to 0085, WO2013/011955, paragraphs 0007 to 0033 and 0059 to 0066, WO2013/081088, paragraphs 0008 to 0071 and 0118 to 0133, JP 2013-256490 A, paragraph 0009 to 0046 and 0093 to 0134, JP 2013-116975 A, paragraphs 0008 to 0020 and 0038-0040, WO2013/133359, paragraphs 0007 to 0032 and 0079 to 0084, WO2013/161437, paragraphs 0008 to 0054 and 0101 to 0121, JP 2014-9352 A, paragraphs 0007 to 0041 and 0060 to 0069, and JP 2014-9224 A, paragraphs 0008 to 0048 and 0067 to 0076. In addition, light-emitting materials described in the following and capable of emitting delayed fluorescence are also preferably employed: JP 2013-253121 A, WO2013/133359, WO2014/034535, WO2014/115743, WO2014/122895, WO2014/126200, WO2014/136758, WO2014/133121, WO2014/136860, WO2014/196585, WO2014/189122, WO2014/168101, WO2015/008580, WO2014/203840, WO2015/002213, WO2015/016200, WO2015/019725, WO2015/072470, WO2015/108049, WO2015/080182, WO2015/072537, WO2015/080183, JP 2015-129240 A, WO2015/129714, WO2015/129715, WO2015/133501, WO2015/136880, WO2015/137244, WO2015/137202, WO2015/137136, WO2015/146541, and WO2015/159541. These patent publications as described in this paragraph are incorporated herein by reference as a part of this description.
Next, preferred compounds for use as a hole injection material are shown below.
MoO$_x$ (x is 1.5 to 3.0)
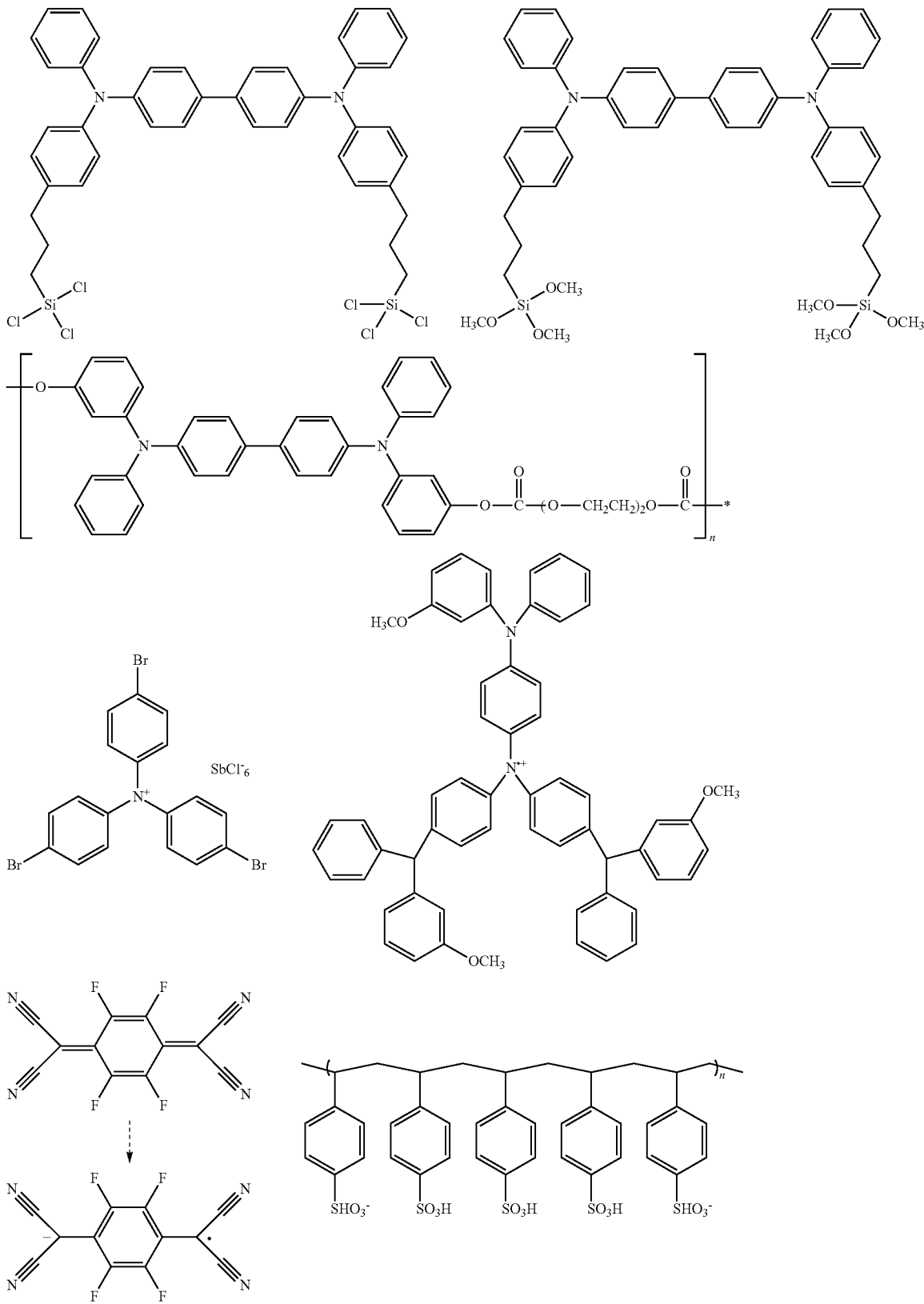

27
-continued
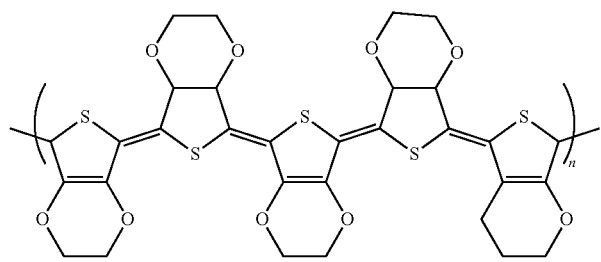
28
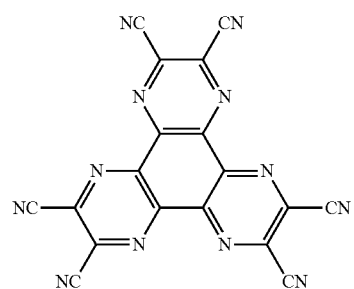
Next, preferred compounds for use as a hole transport material are shown below.
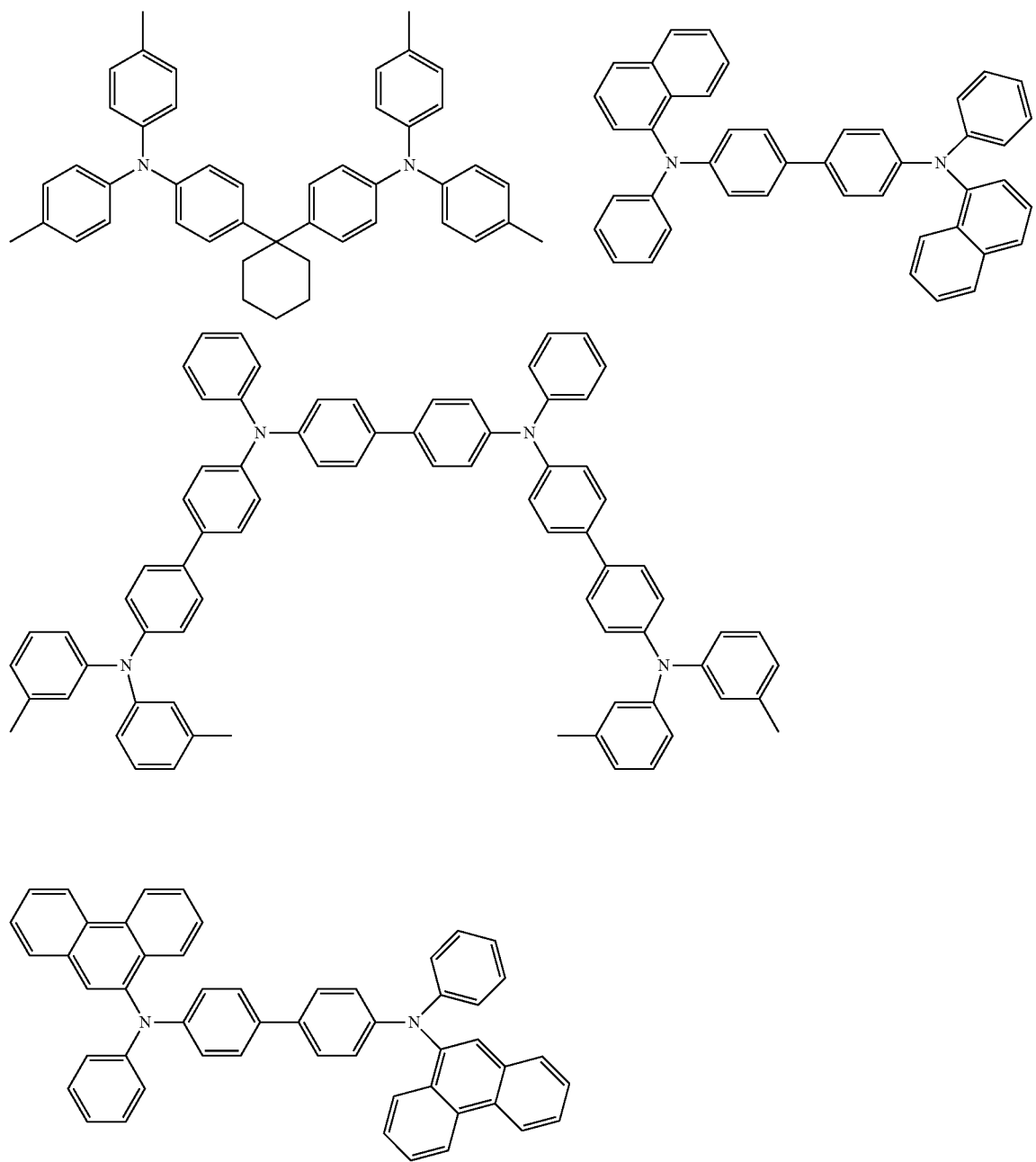

-continued
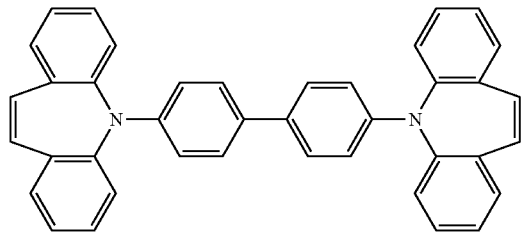
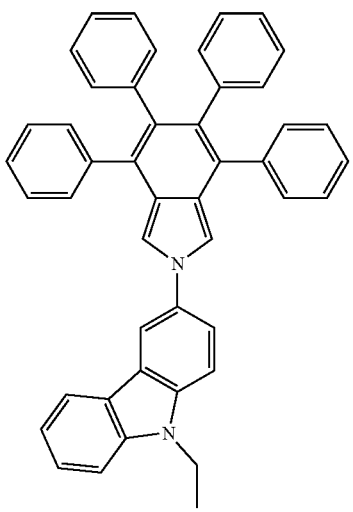
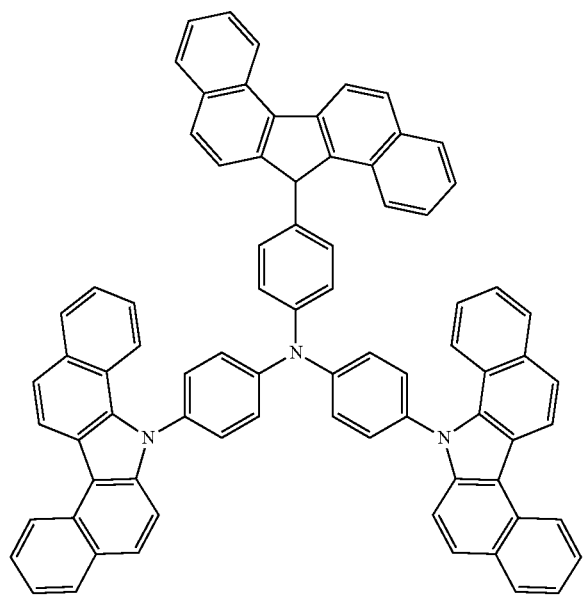
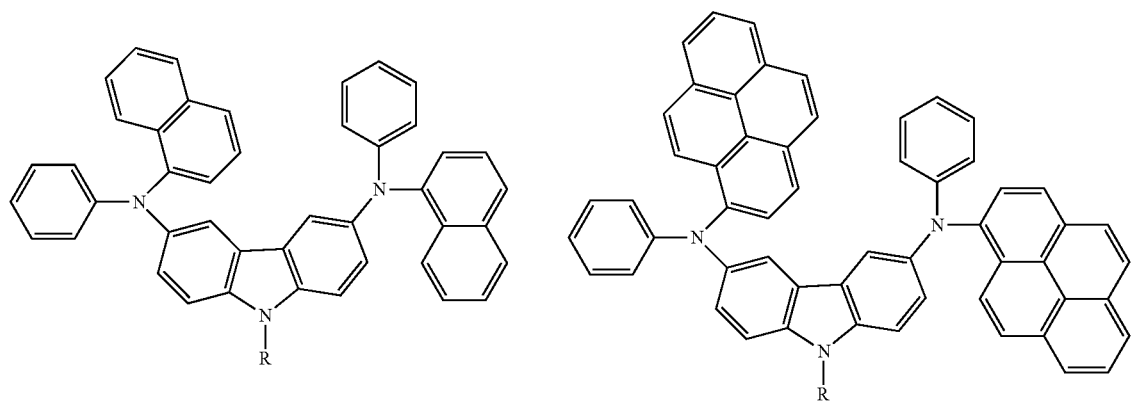

-continued
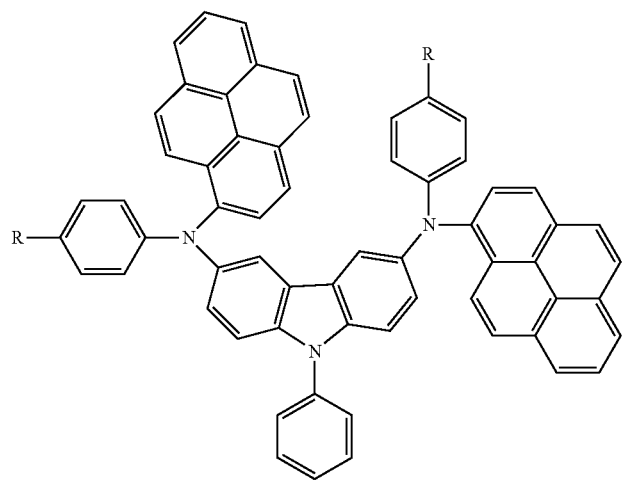
R = alkyl, aryl, aryloxy, 9,9′-dialkylfluorene
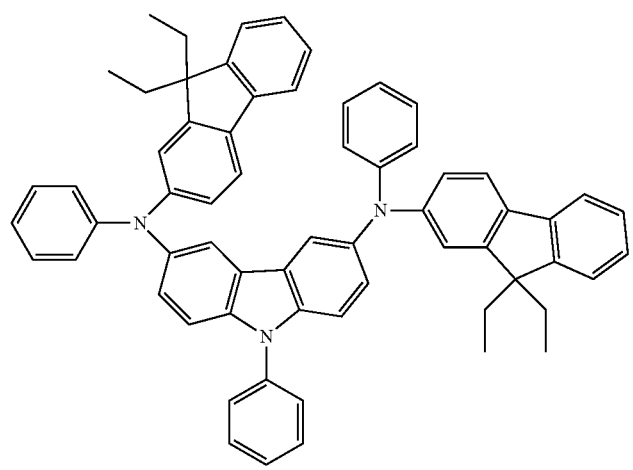
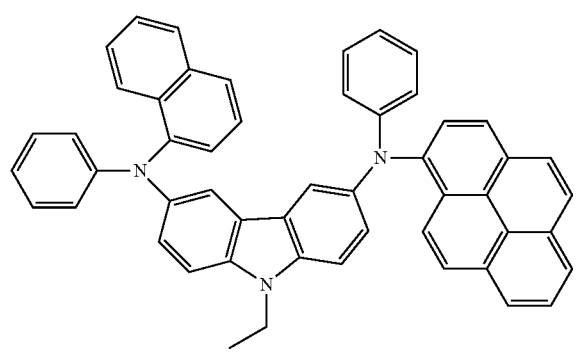
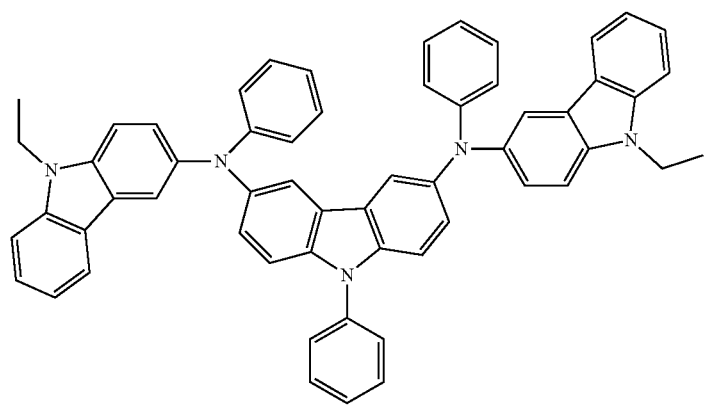

-continued
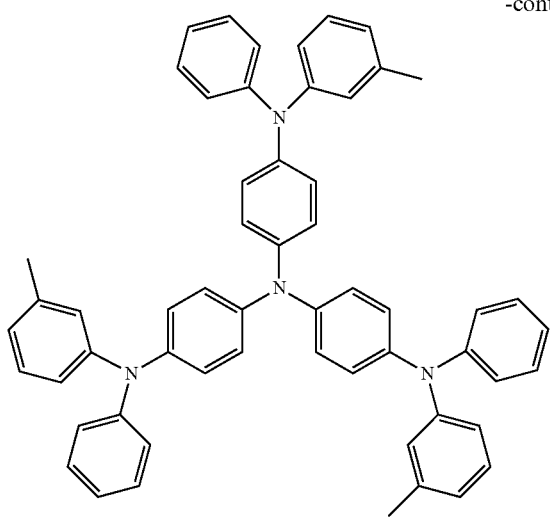
33
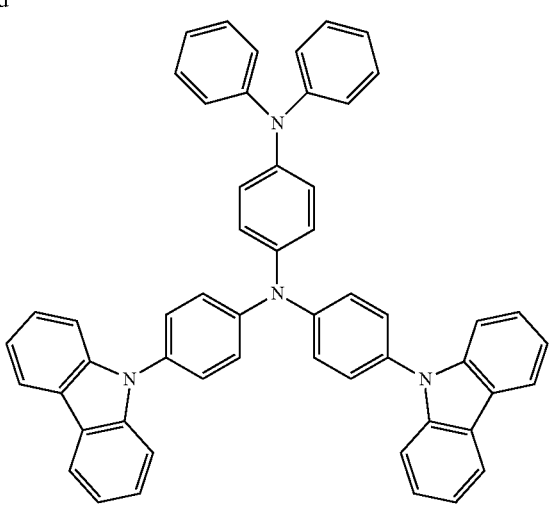
34
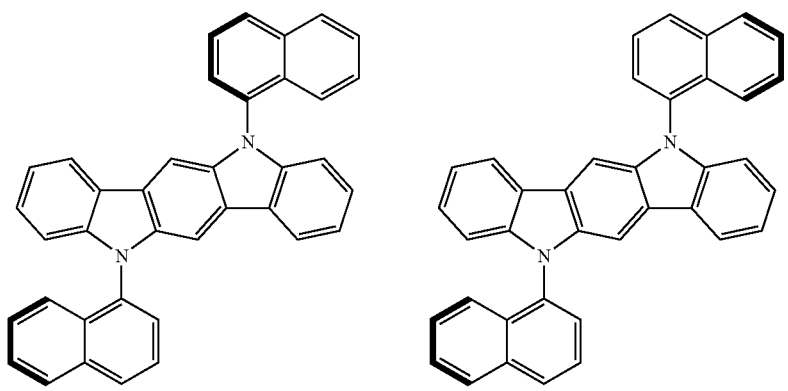
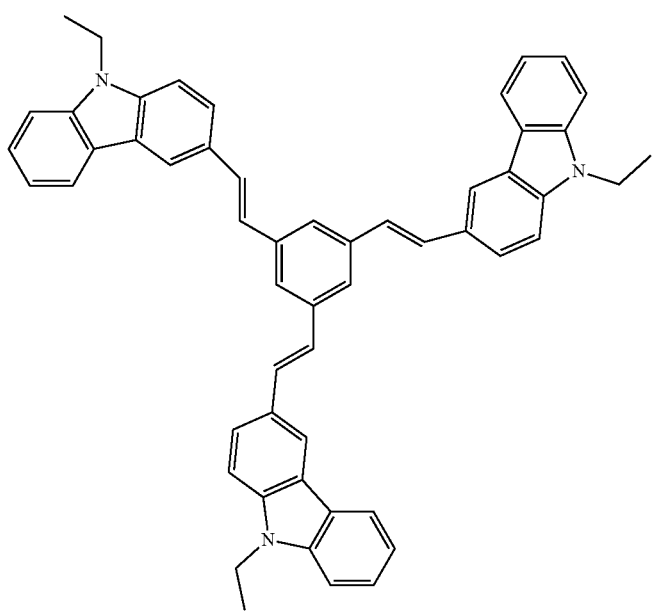

-continued
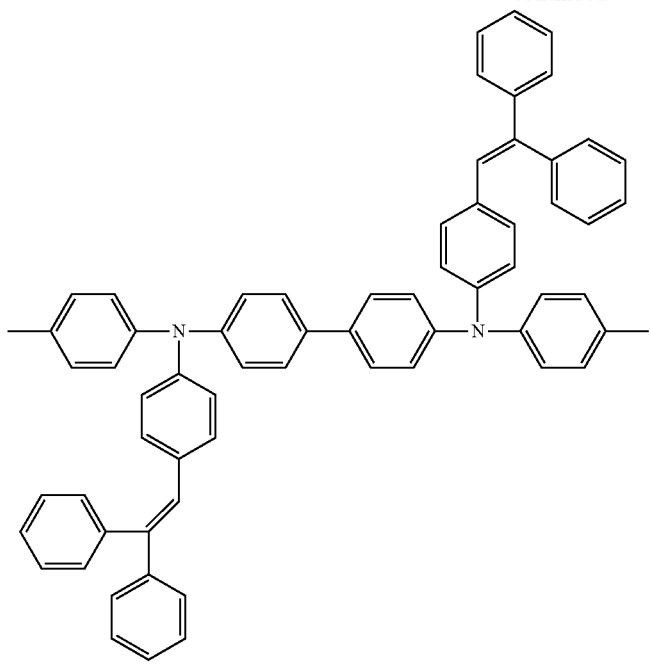
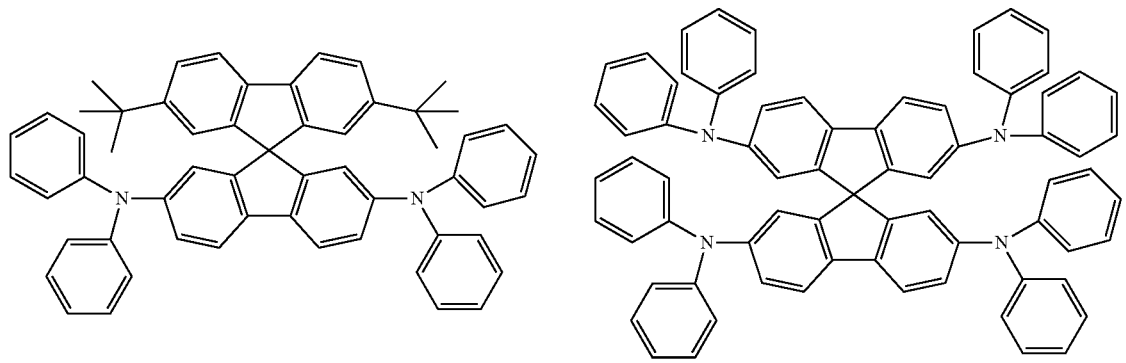
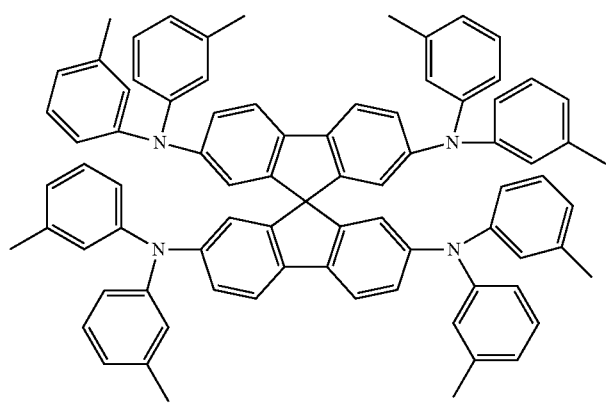

-continued
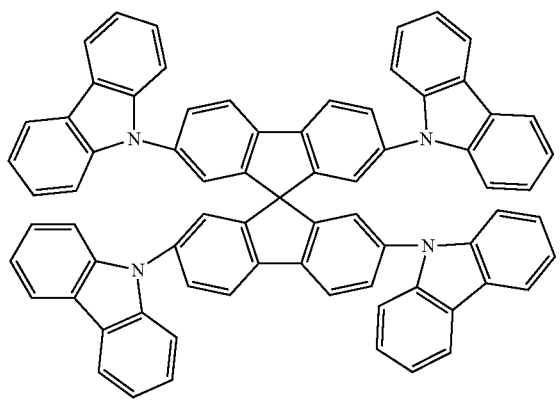
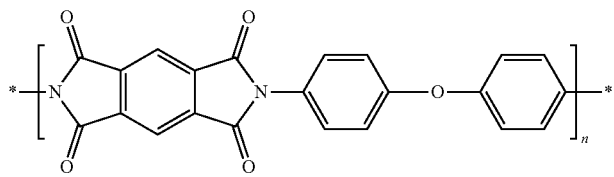
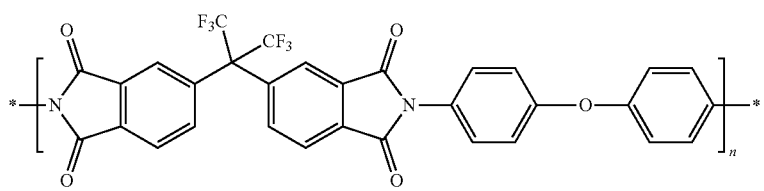
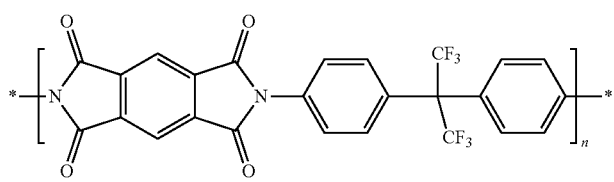
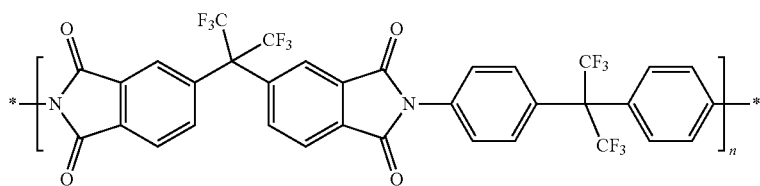
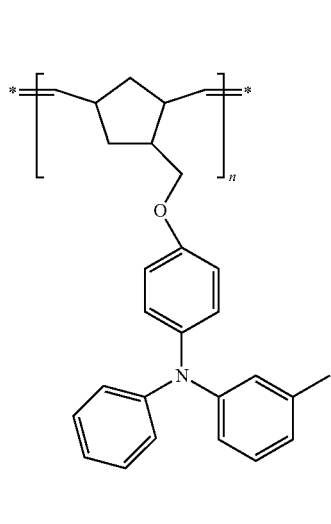
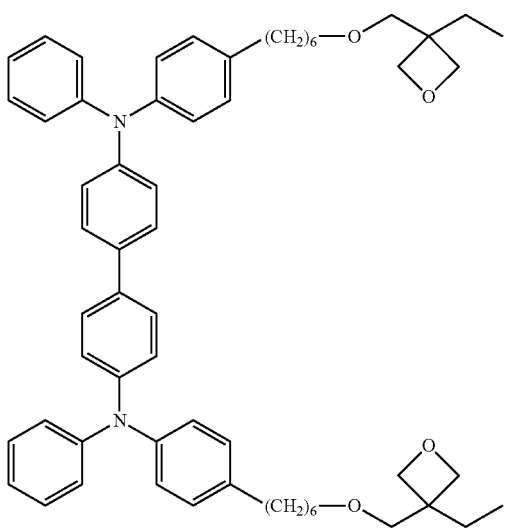

-continued
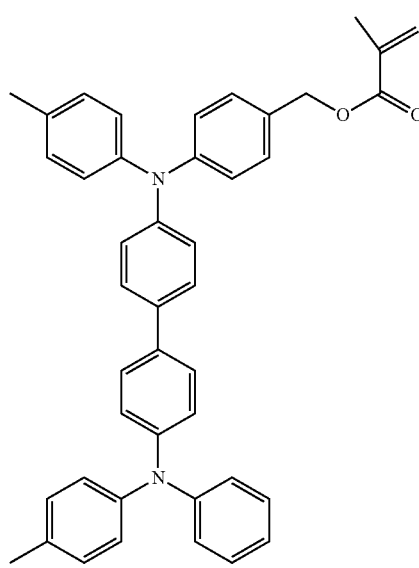
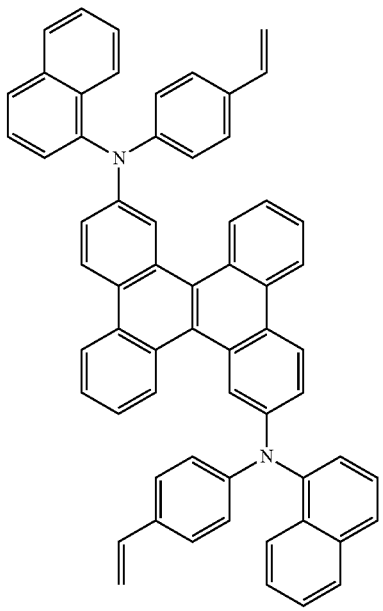
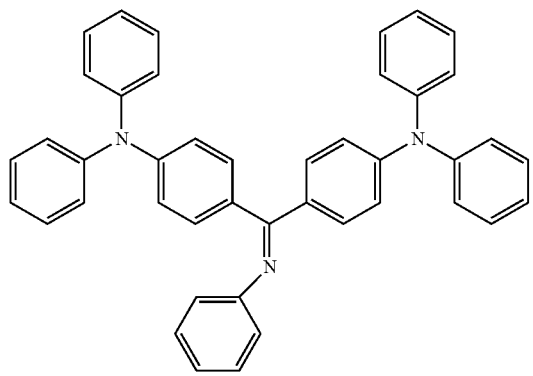
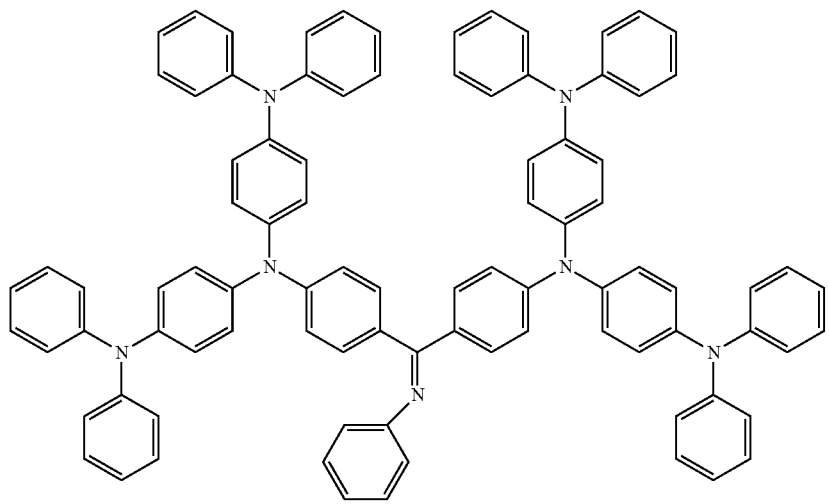

-continued
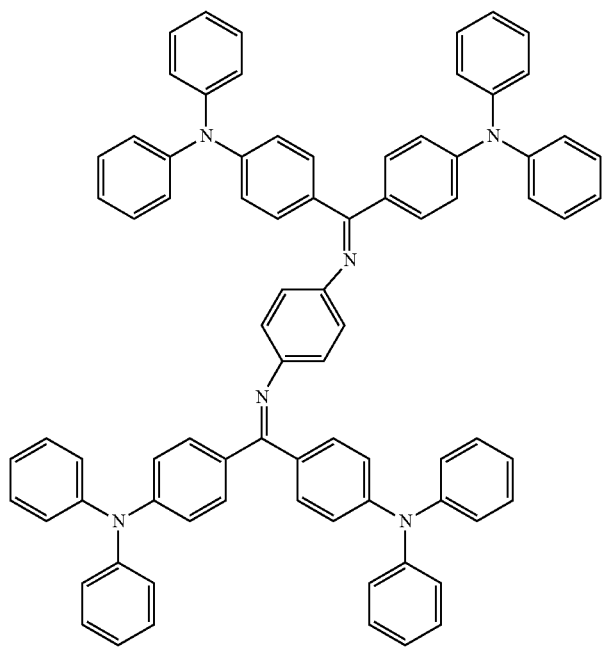
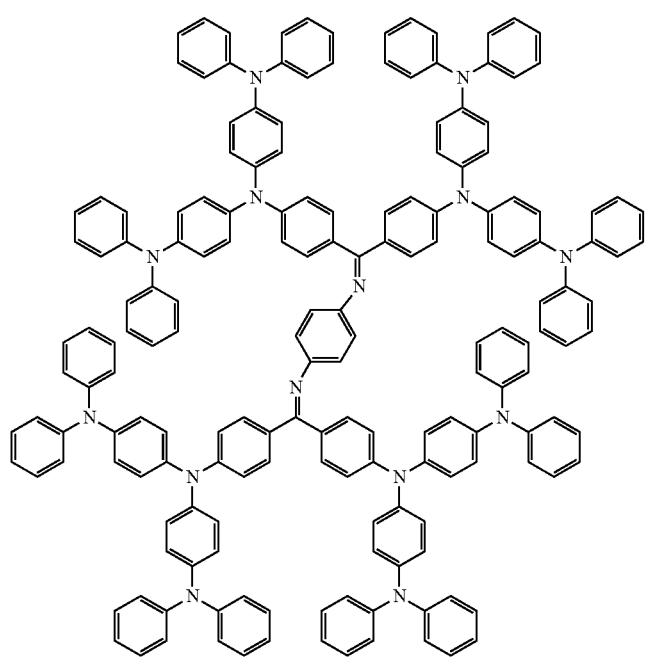

-continued
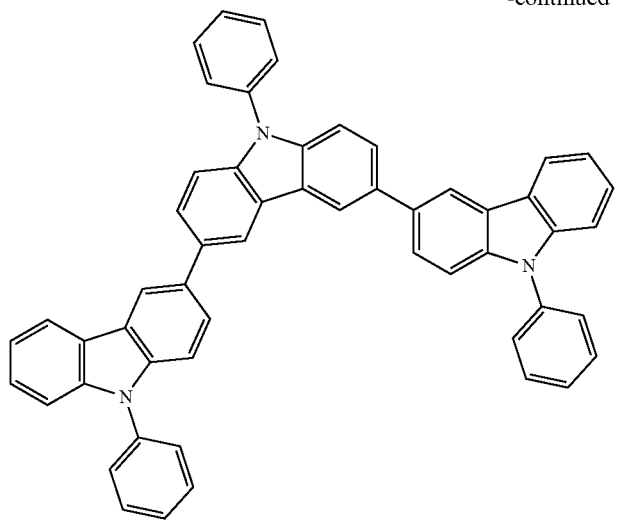
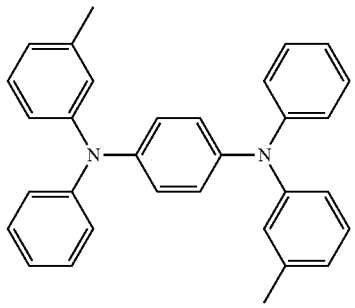
Next, preferred compounds for use as an electron blocking material are shown below.
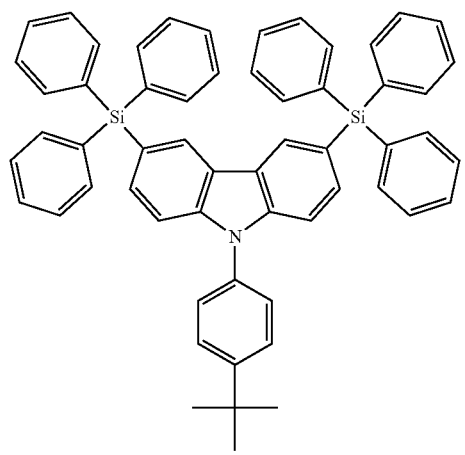
-continued
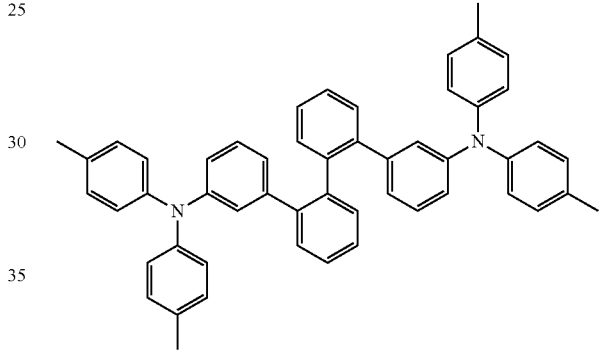
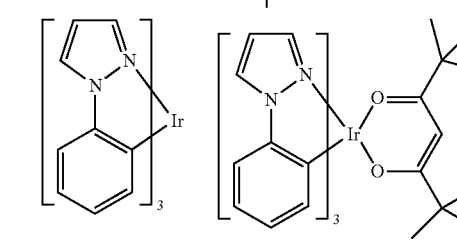
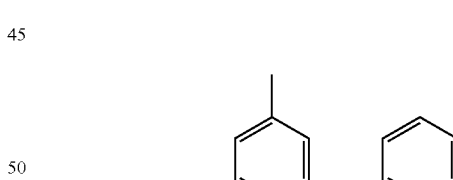
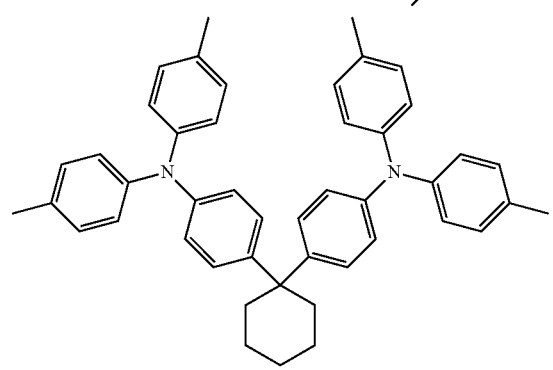
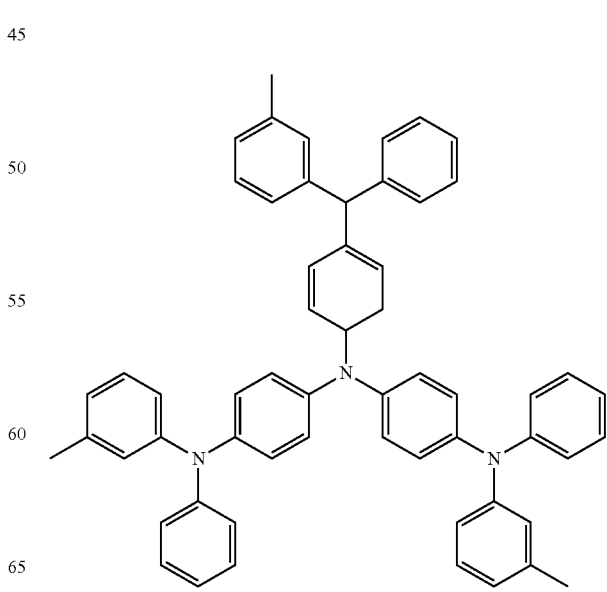
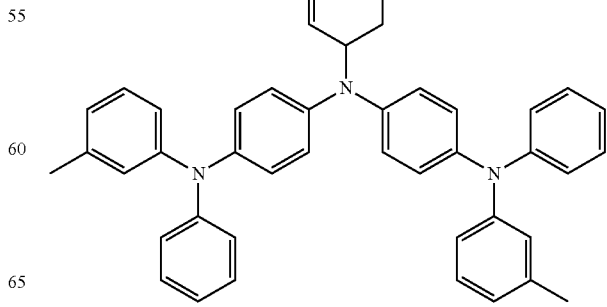

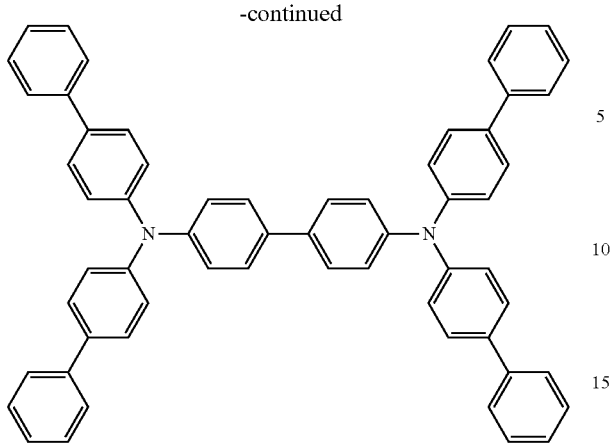
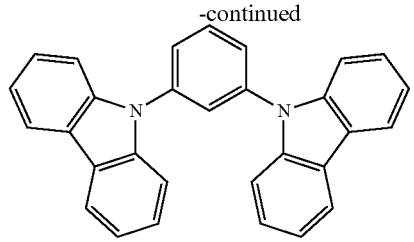
Next, preferred compounds for use as a hole blocking material are shown below.
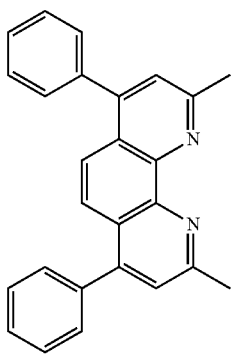
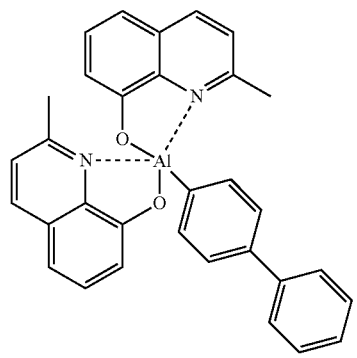
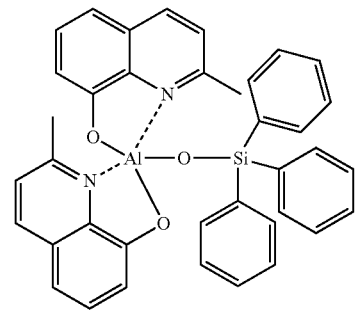
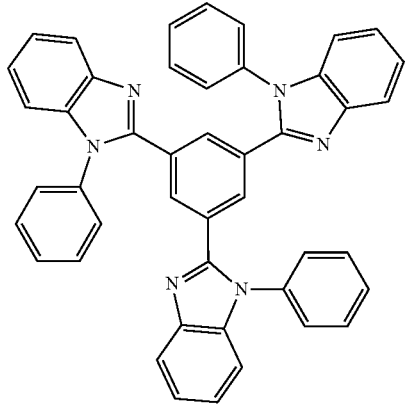
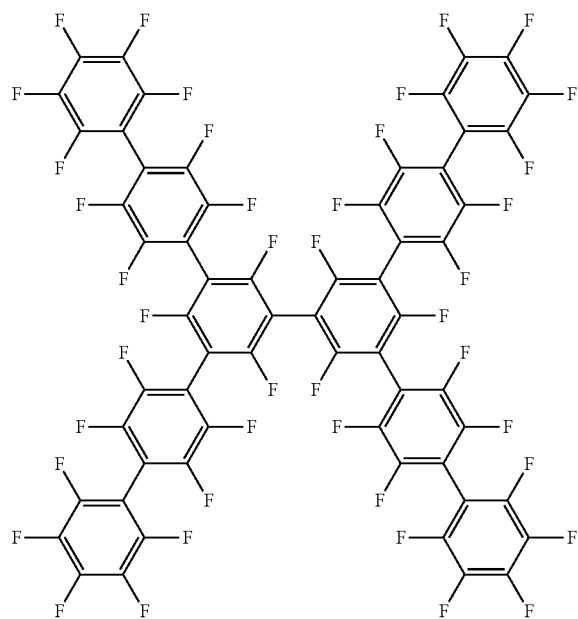

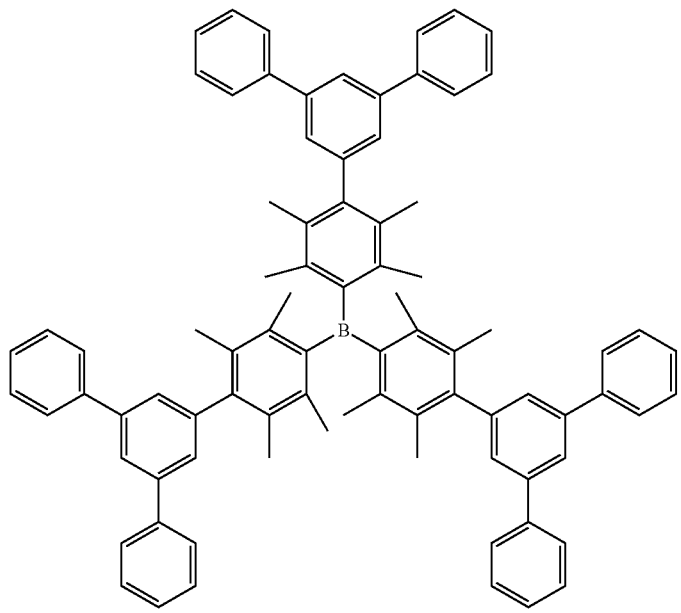
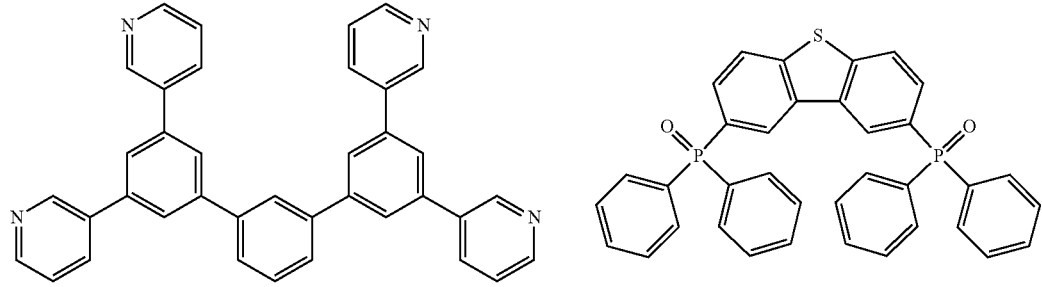
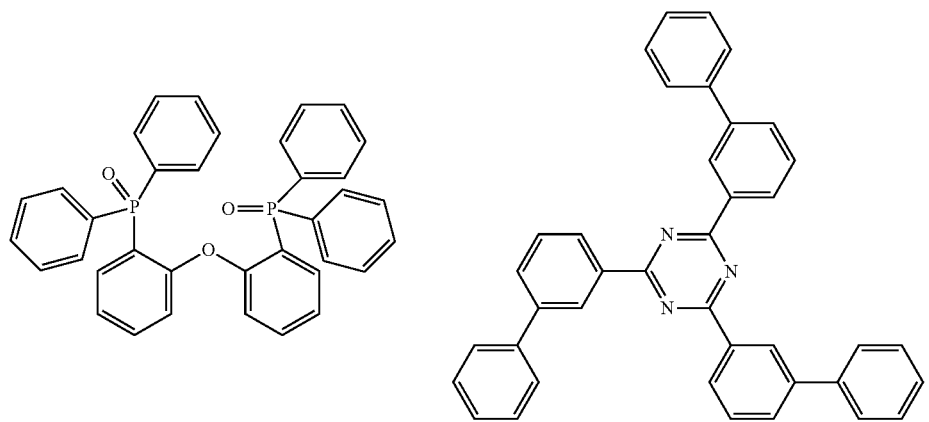

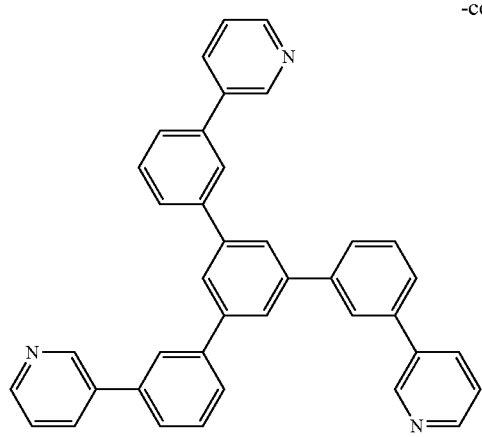
Next, preferred compounds for use as an electron transport material are shown below.
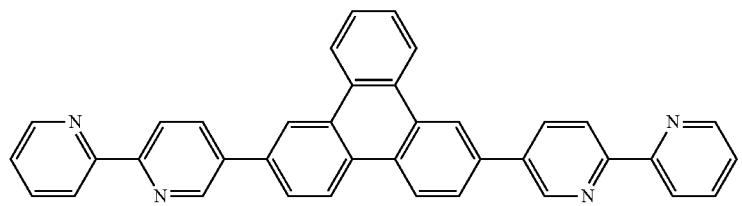
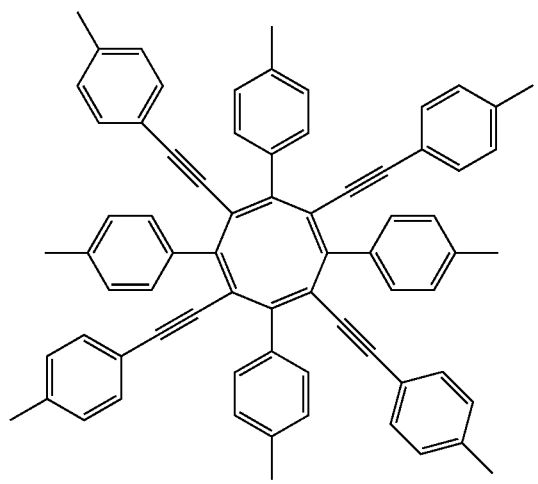
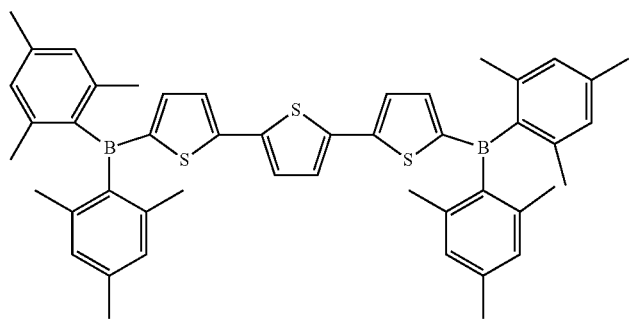

51
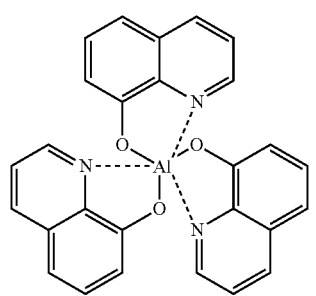
-continued
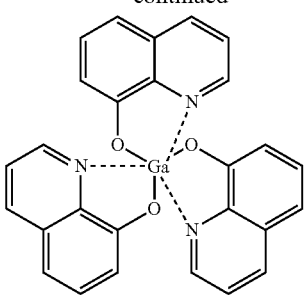
52
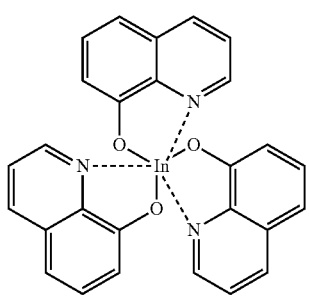
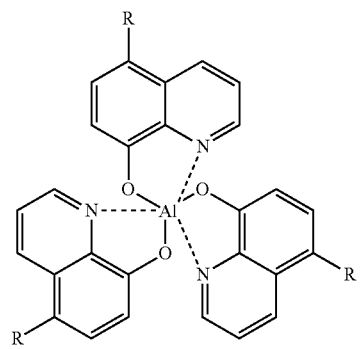
R = H, alkyl, aryl, heteroaryl
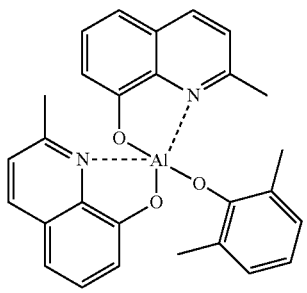
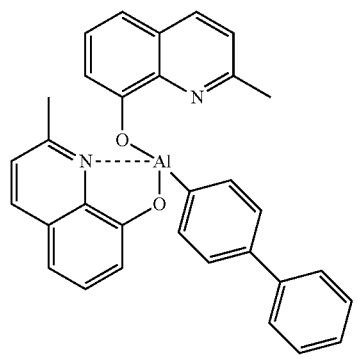
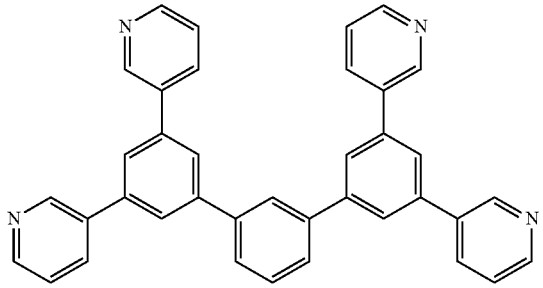
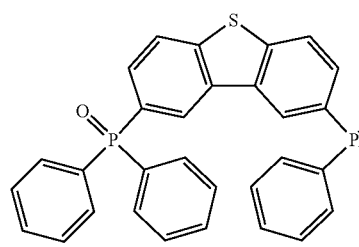
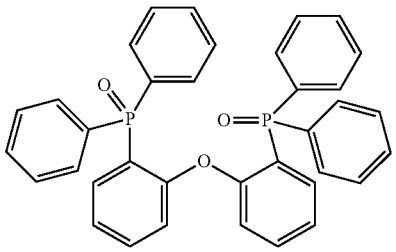
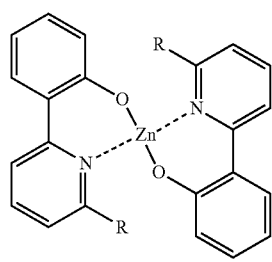
R = H
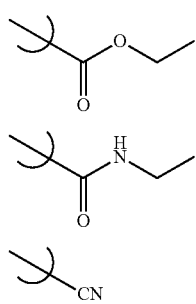
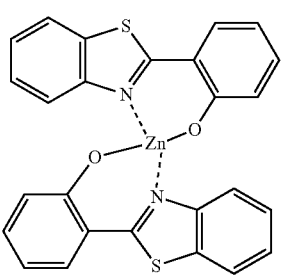

53 54
-continued
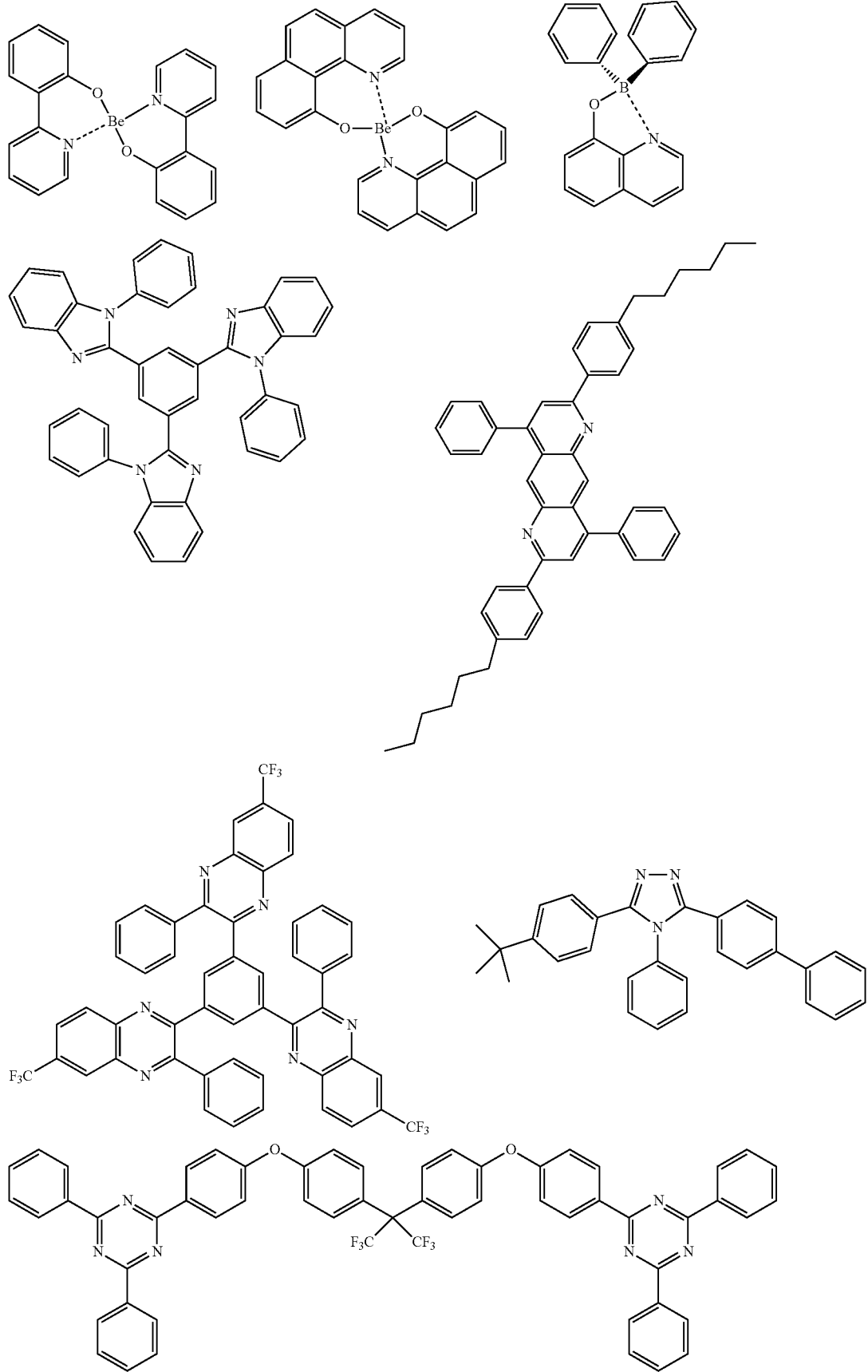

-continued
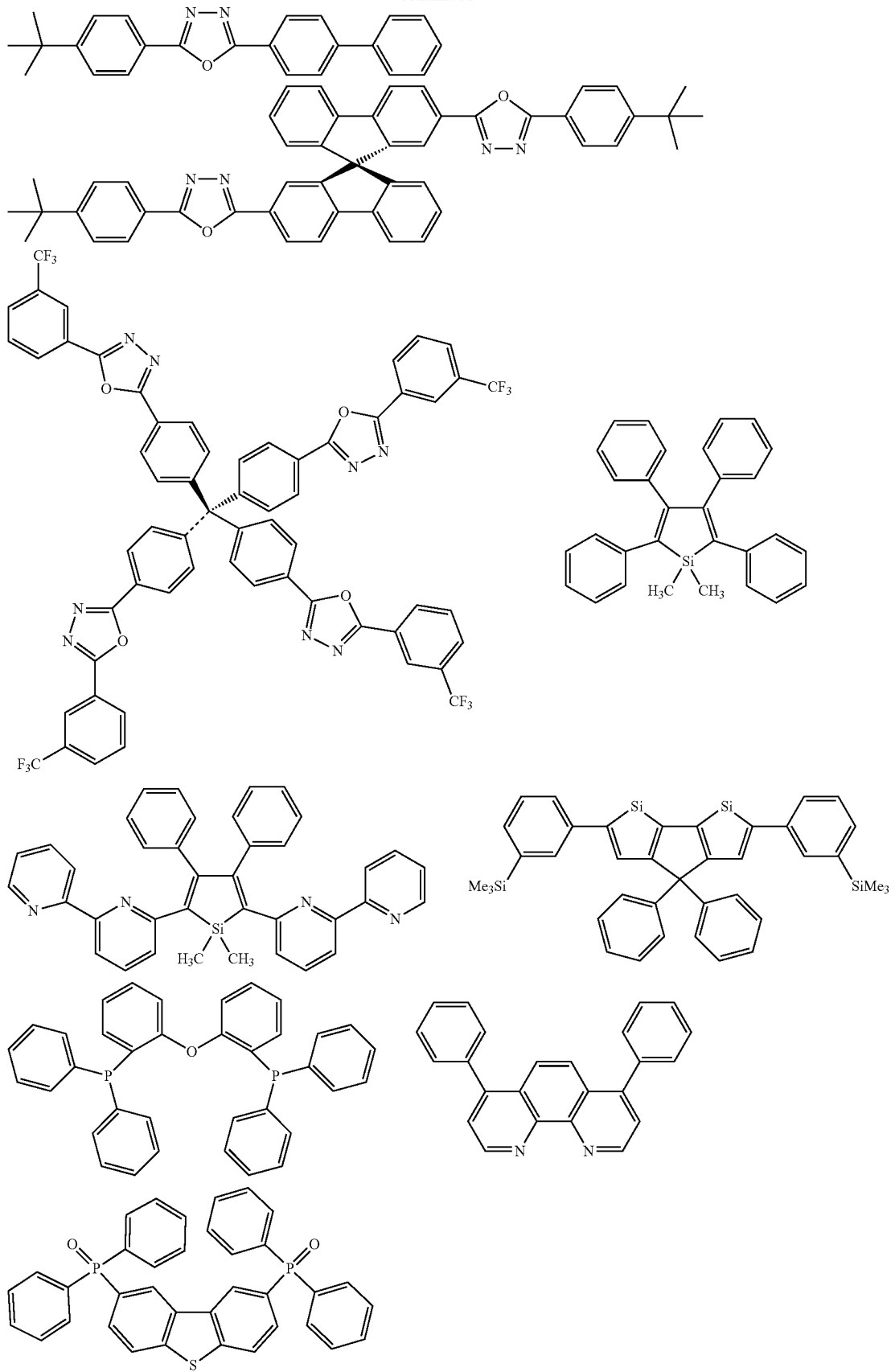

Next, preferred compounds for use as an electron injection material are shown below.

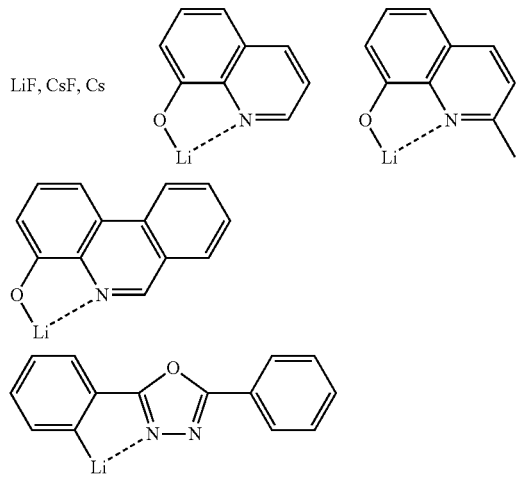

Further, preferred compounds for use as additional materials are mentioned below. For example, these are considered to be added as a stabilization material.

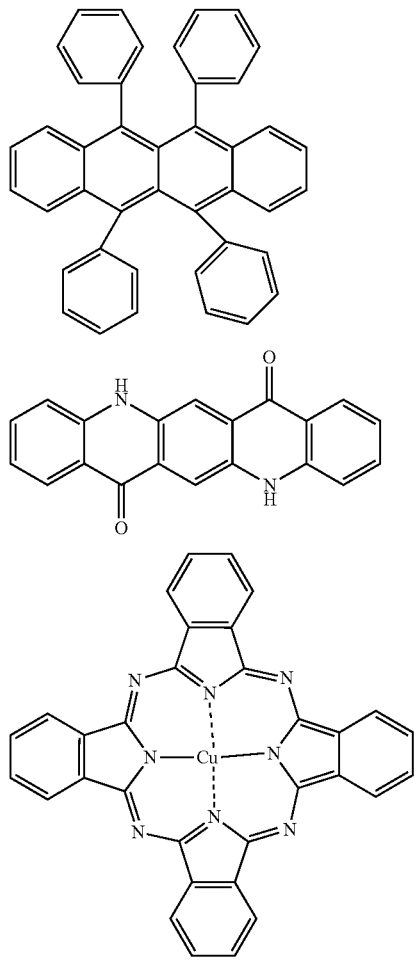

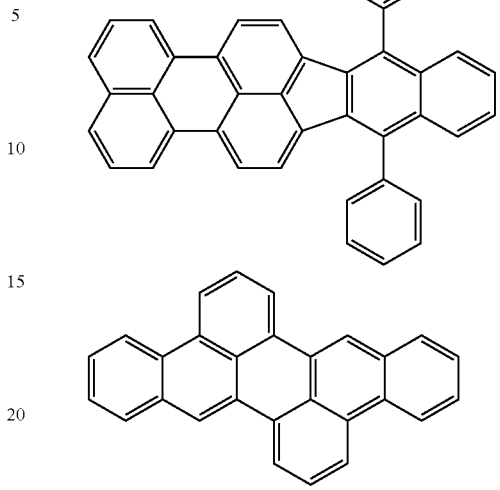

The organic electroluminescent device thus produced by the aforementioned method emits light on application of an electric field between the anode and the cathode of the device. In this case, when the light emission is caused by the excited singlet energy, light having a wavelength that corresponds to the energy level thereof may be confirmed as fluorescent light and delayed fluorescent light. When the light emission is caused by the excited triplet energy, light having a wavelength that corresponds to the energy level thereof may be confirmed as phosphorescent light. The normal fluorescent light has a shorter light emission lifetime than the delayed fluorescent light, and thus the light emission lifetime may be distinguished between the fluorescent light and the delayed fluorescent light.

On the other hand, the phosphorescent light may substantially not be observed with a normal organic compound such as the compound of the present invention at room temperature since the excited triplet energy is converted to heat or the like due to the instability thereof, and is immediately deactivated with a short lifetime. The excited triplet energy of the normal organic compound may be measured by observing light emission under an extremely low temperature condition.

The organic electroluminescent device of the invention may be applied to any of a single device, a structure with plural devices disposed in an array, and a structure having anodes and cathodes disposed in an X-Y matrix. According to the present invention in which the hole transport layer or the electron transport layer is composed of a perovskite layer having a thickness of 50 nm or more, there can be provided an organic light-emitting device having a low drive voltage and having a high power efficiency, and capable of evading interelectrode short-circuiting and current leakage. The organic light-emitting device such as the organic electroluminescent device of the present invention may be applied to a further wide range of purposes. For example, an organic electroluminescent display apparatus may be produced with the organic electroluminescent device of the invention, and for the details thereof, reference may be made to S. Tokito, C. Adachi and H. Murata, "Yuki EL Display" (Organic EL Display) (Ohmsha, Ltd.). In particular, the organic electroluminescent device of the invention may be applied to organic electroluminescent illumination and backlight which are highly demanded.

EXAMPLES

Hereafter, with reference to Examples, features of the present invention are more specifically described. Materials, details of processes, process steps, and the like as shown below can be changed as appropriate without departing from the spirit of the present invention. Accordingly, the scope of the present invention should not be construed as limited by specific examples as shown below. X-ray diffraction analyses were performed using X-ray diffractometer (Ultima IV, Rigaku), absorption spectroscopy was performed using a UV-Vis-NIR spectrometer (LAMBDA950, Perkin Elmer), emission characteristics were evaluated using a fluorospectrophotometer (FluoroMax-4, Horiba), and organic EL characteristics were evaluated using an external quantum efficiency measuring device (C9920-12, Hamamatsu Photonics) and an organic EL durability evaluation system (EAS-26B, System Engineer).

Excitation light intensity dependence of PL quantum yield was evaluated using a multichannel photodetector (PMA-12, Hamamatsu Photonics) by irradiating a device with a 365-nm continuous excitation light from an ultraviolet LED in the normal direction of the substrate of the device and by detecting the light emission from the device at an angle of 45°. Here, the PL quantum yield is determined based on the absorption spectrum and the emission spectrum of a film of tris(8-hydroxyquinolinato)aluminum (Alq3) having a PL quantum yield of 20%.

In these Examples, the vacuum degree in film formation according to a vacuum evaporation method was set at $10^{-4}$ Pa.

(Example 1) Production of Organic Photoluminescent Device Using $CH_3NH_3PbCl_3$ as a Perovskite-Type Compound (Host Material) and Using Coumarin 153 as a Light-Emitting Material On a quartz substrate, methylammonium chloride ($CH_3NH_3Cl$), lead(II) chloride ($PbCl_2$) and Coumarin 153 were co-deposited from different evaporation sources to form thereon a thin film (coumarin-added perovskite film) having a thickness of 50 inn, thereby giving an organic photoluminescent device. At that time, the molar ratio of methylammonium chloride to lead(II) chloride was 1/1 and the concentration of Coumarin 153 was 1% by weight.

Apart from this, organic photoluminescent devices were produced in the same manner as above except that the concentration of Coumarin 153 in the thin film was varied within a range of 0.2 to 1.3% by weight.

(Comparative Example 1) Production of Organic Photoluminescent Device Using mCBP as a Host Material and Using Coumarin 153 as a Light-Emitting Material On a quartz substrate, mCBP and Coumarin 153 were co-deposited from different evaporation sources to form thereon a thin film (coumarin-added mCBP film) having a thickness of 50 nm, thereby giving an organic photoluminescent device. At that time, the concentration of Coumarin 153 was 1% by weight.

Apart from this, organic photoluminescent devices were produced in the same manner as above except that the concentration of Coumarin 153 in the thin film was varied within a range of 0.2 to 1.3% by weight.

(Comparative Example 2) Production of Organic Photoluminescent Device Using $CH_3NH_3PbCl_3$ On a quartz substrate, methylammonium chloride ($CH_3NH_3Cl$) and lead(II) chloride ($PbCl_2$) were co-deposited from different evaporation sources to form thereon a thin film (coumarin-free perovskite film) having a thickness of 50 nm, thereby giving an organic photoluminescent device. At that time, the molar ratio of methylammonium chloride to lead(II) chloride was 1/1.

The thin film formed in Example 1 and the thin film formed in Comparative Example 2 each were analyzed to measure the X-ray diffraction spectrum thereof, in which a diffraction peak was detected at the same position as that in the X-ray diffraction spectrum of a known $CH_3NH_3PbCl_3$ single crystal. As a result of XPS (X-ray photoemission spectroscopy) of the films, Cl/Pb, N/Pb and F/Pb were all close to theoretical values. The results confirm that the thin film formed in Example 1 and Comparative Example 2 all had a perovskite-type crystal structure of $CH_3NH_3PbCl_3$. The thin film formed in Example 1 and the thin film formed in Comparative Example 2 all had almost the same X-ray diffraction pattern profile, which confirmed that almost all the Coumarin 153 molecules in the thin film formed in Example 1 exist in each crystal or grain boundary constituting polycrystalline $CH_3NH_3PbCl_3$. The arithmetic mean roughness Ra of the thin film formed in Example 1 was 6.9 nm, and the arithmetic mean roughness Ra of the thin film formed in Comparative Example 2 was 10.0 nm.

Figure 2:
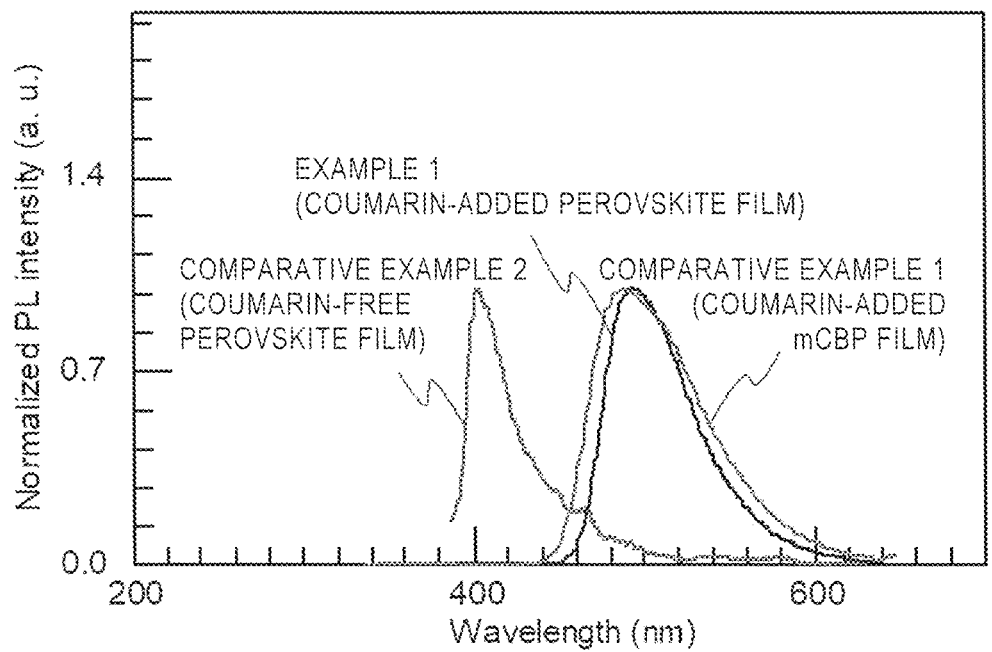
FIG. 2 This shows an emission spectrum of each thin film formed in Example 1, Comparative Example 1 and Comparative Example 2.
Figure 3:
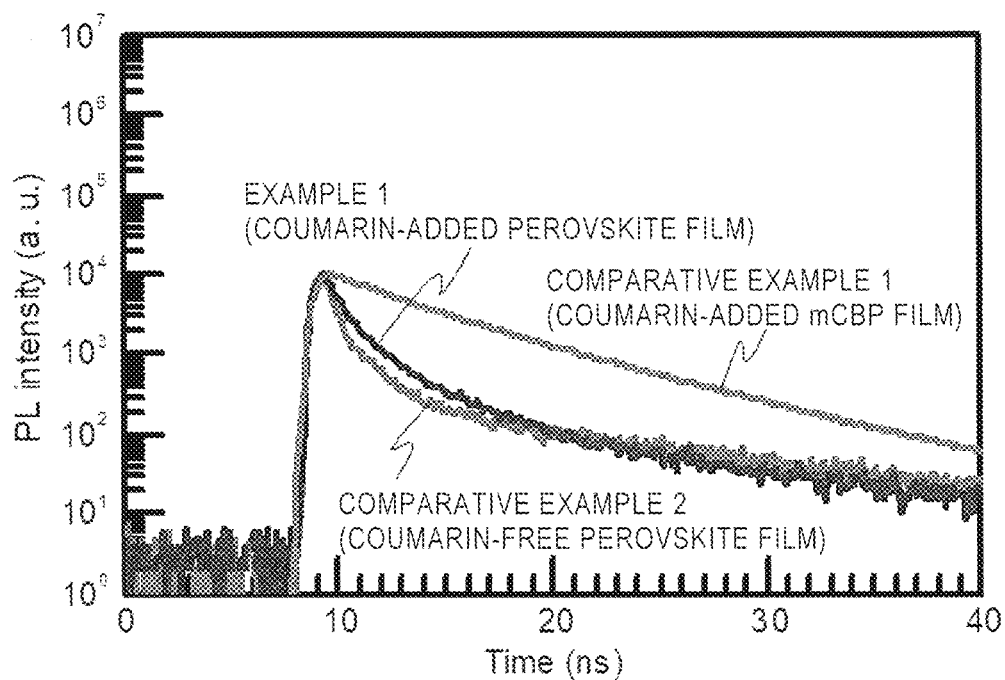
FIG. 3 This shows a transient decay curve of light emission from each thin film formed in Example 1, Comparative Example 1 and Comparative Example 2.
Figure 4:
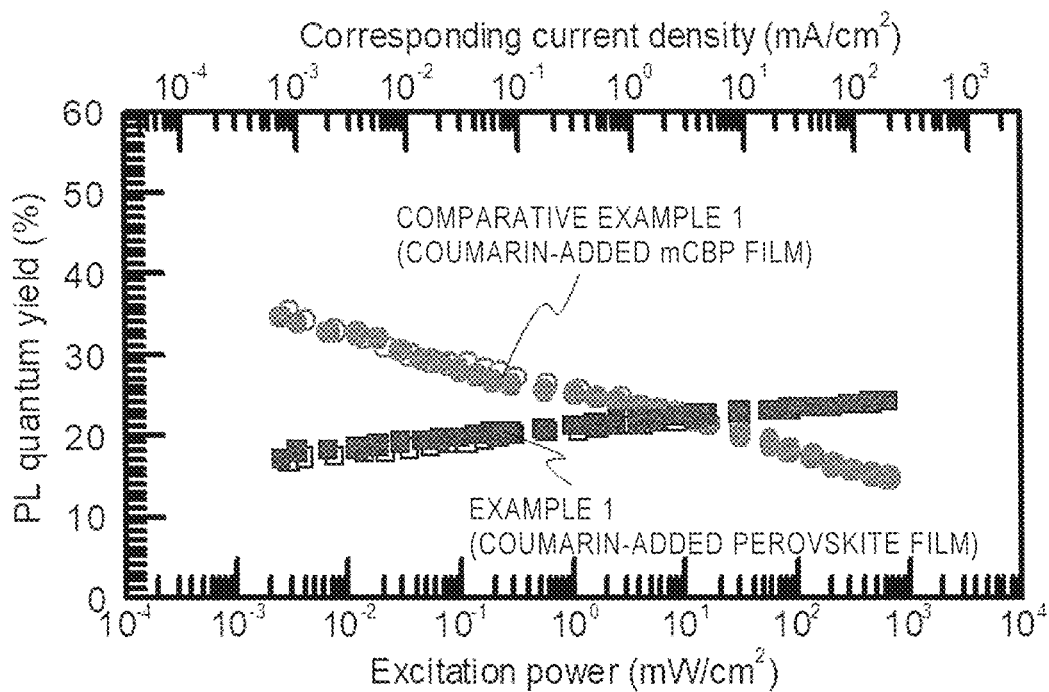
FIG. 4 This is a graph showing an excitation light intensity-dependent PL quantum yield of each thin film formed in Example 1 and Comparative Example 1.
Figure 5:
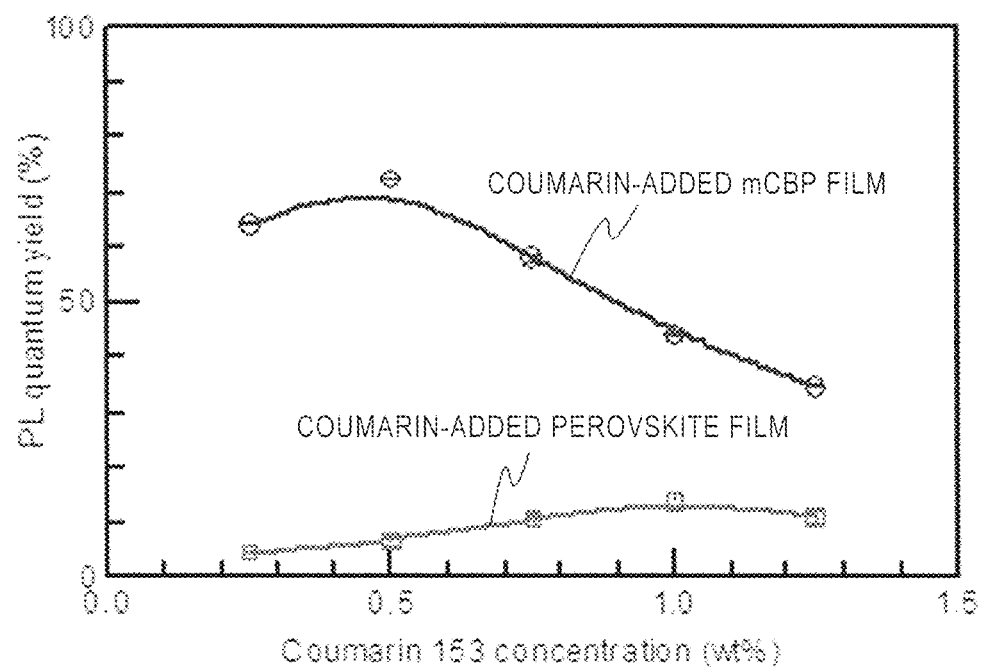
FIG. 5 This is a graph showing a Coumarin 153 concentration-dependent PL quantum yield at a low excitation light intensity ($10^{-4}$ mW/cm$^2$) of a thin film having a perovskite-type compound as a host material and a thin film having mCBP as a host material.

FIG. 2 shows an emission spectrum with 300 nm excitation light of each thin film formed in Example 1, and Comparative Examples 1 and 2; FIG. 3 shows a transient decay curve of light emission; FIG. 4 shows an excitation light intensity-dependent photoluminescent quantum yield (PL quantum yield); and FIG. 5 shows a Coumarin 153 concentration-dependent photoluminescent quantum yield (PL quantum yield) at a low excitation light intensity ($10^{-4}$ mW/cm$^2$).

As shown in FIG. 2, the thin film of Comparative Example 2 not doped with Coumarin 153 (coumarin-free perovskite film) did not have an emission peak at 402 nm, while the thin film of Example 1 doped with Coumarin 153 (coumarin-added perovskite film) lost an emission peak at 402 nm but had an emission peak at nearly the same position as that of the thin film of Comparative Example 1 (coumarin-added mCBP film). From this, it is known that in the thin film of Example 1, the excitation energy formed in the perovskite-type compound was not utilized for light emission of the perovskite-type compound itself but transferred to the light-emitting material Coumarin 153 and was used for light emission from the light-emitting material The thin film of Example 1 and the thin film of Comparative Example 2 were analyzed to measure the photoabsorption spectrum thereof, and the absorption spectra of the two were almost the same.

From FIG. 3, it is known that the emission intensity from the thin film of Comparative Example 1 using mCBP as a host material linearly decayed but the emission intensity from the thin film of Example 1 using $CH_3NH_3PbCl_3$ as a host material tended to decay multi-exponentially. The reason why the emission intensity from the thin film of Example 1 decayed multi-exponentially can be presumed to be because in this thin film, not only radiative relaxation from the excited state to a ground state but also trapping of excitons and carriers by the defect state (defect level) of the film would participate in emission decay.

On the other hand, as shown in FIG. 4, in the thin film of Comparative Example 1 using mCBP as a host material, the relationship diagram of the excitation light intensity and the PL quantum yield has a negative inclination, but in the thin film of Example 1 using $CH_3NH_3PbCl_3$ as a host material, the relationship diagram of the excitation light intensity and the PL quantum yield has a positive inclination. The reason why in the thin film of Comparative Example 1, the relationship diagram of the excitation light intensity and the PL quantum yield has a negative inclination can be presumed to be because, with the increase in the excitation light intensity, the exciton density in Coumarin 153 would increase to readily cause exciton-exciton annihilation in the thin film. As opposed to this, the reason why in the thin film of Example 1, the relationship diagram of the excitation light intensity and the PL quantum yield has a positive inclination can be presumed to be because, with the increase in the excitation light intensity, the defect level of the film could be filled up with excitons and carriers and therefore the excitons to be formed further could no more be trapped by the defect level and the energy thereof could be effectively utilized for light emission.

(Measurement of Hole Mobility and Electron Mobility in $CH_3NH_3PbCl_3$ Film)

On a glass substrate with an anode of indium tin oxide (ITO) having a thickness of 100 nm formed thereon, thin films were layered according to a vacuum vapor deposition method to produce a hole transport device and an electron transport device.

First, on ITO, $MoO_3$ was formed in a thickness of 10 nm to be a hole injection layer. Subsequently, methylammonium chloride ($CH_3NH_3Cl$) and lead(II) chloride ($PbCl_2$) were co-deposited from different evaporation sources to form a layer of $CH_3NH_3PbCl_3$ having a thickness of 3000 nm. At that time, the molar ratio of methylammonium chloride and lead(II) chloride was 1/1. Next, $MoO_3$ was formed in a thickness of 10 nm to be an electron blocking layer, and on this, Al was deposited in a thickness of 100 nm to be a cathode, thereby providing a laminate. The laminate was transferred into a glove box filled with nitrogen gas, a pair of glass plates were arranged on and below it and sealed up with a UV epoxy resin to give a hole transport device.

On the other hand, Cs was deposited on ITO in a thickness of 0.5 nm to form a hole blocking layer. Next, methylammonium chloride ($CH_3NH_3Cl$) and lead(II) chloride ($PbCl_2$) were co-deposited from different evaporation sources to form a layer of $CH_3NH_3PbCl_3$ having a thickness of 3000 nm. At that time, the molar ratio of methylammonium chloride and lead(II) chloride was 1/1. Next, Cs was deposited in a thickness of 0.5 nm to be an electron injection layer, and on this, Al was deposited in a thickness of 100 nm to be a cathode, thereby providing a laminate. The laminate was transferred into a glove box filled with nitrogen gas, a pair of glass plates were arranged on and below it and sealed up with a UV epoxy resin to give an electron transport device.

Figure 6:
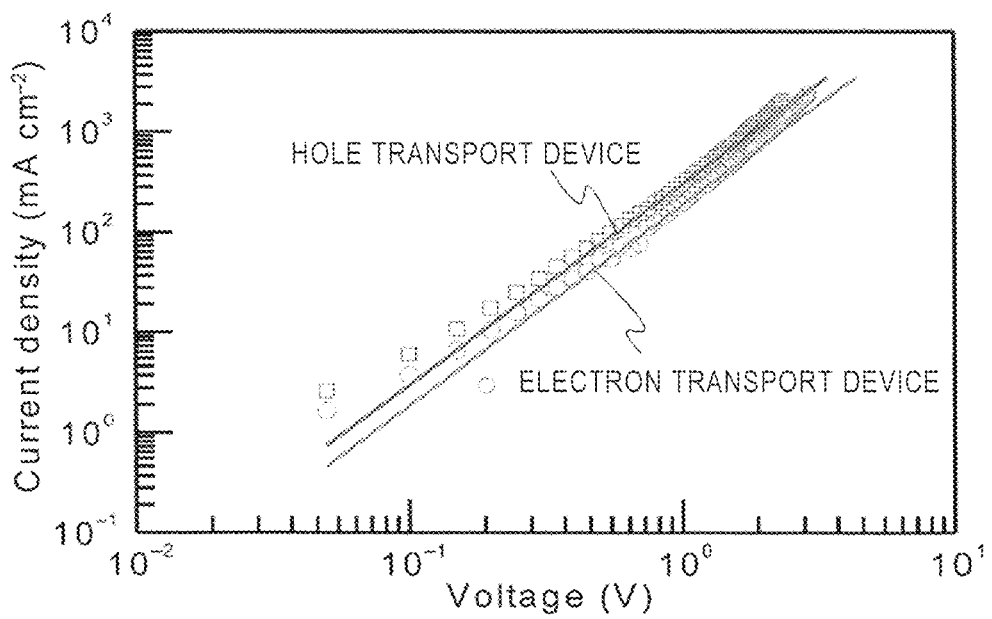
FIG. 6 This is a graph showing a current density-voltage characteristic of a hole transport device and an electron transport device.

Current density-voltage characteristics of the produced hole transport device and the electron transport device are shown in FIG. 6. As shown in FIG. 6, the current-density-voltage characteristic of each device is a space-charge limited current-like pattern. From each pattern, the carrier mobility was calculated. The hole mobility was 3.4 $cm^2V^{-1}s^{-1}$, and the electron mobility was 2.1 $cm^2V^{-1}s^{-1}$, and these are far higher than the carrier mobility through an amorphous organic film of mCBP ($<10^{-3}$ $cm^2V^{-1}s^{-1}$).

(Example 2) Production of Organic Electroluminescent Device Using $CH_3NH_3PbCl_3$ as a Perovskite-Type Compound (Host Material) and Using Coumarin 153 as a Light-Emitting Material On a glass substrate with an anode of indium tin oxide (ITO) having a thickness of 100 nm formed thereon, thin films were layered according to a vacuum vapor deposition method. First, on ITO, HAT-CN was formed in a thickness of 10 nm, and on this, Tris-PCz was formed in a thickness of 50 nm. Subsequently, methylammonium chloride ($CH_3NH_3Cl$), lead(II) chloride ($PbCl_2$) and Coumarin 153 were co-deposited from different evaporation sources to form a light-emitting layer. At that time, the molar ratio of methylammonium chloride and lead(II) chloride was 1/1, and the concentration of Coumarin 153 was 1% by weight. Next, T2T was formed in a thickness of 20 nm, and on this, BPy-TP2 was formed in a thickness of 40 nm. Further, lithium fluoride (LiF) was deposited in a thickness of 0.8 nm, and then aluminum (Al) was deposited in a thickness of 100 nm to be a cathode, thereby providing a laminate. The laminate was transferred into a glove box filled with nitrogen gas, a pair of glass plates were arranged on and below it and sealed up with a UV epoxy resin to give an organic electroluminescent device.

(Comparative Example 3) Production of Organic Electroluminescent Device Using mCBP as a Host Material and Using Coumarin 153 as a Light-Emitting Material An organic electroluminescent device was produced in the same manner as in Example 2 except that mCBP and Coumarin 153 were co-deposited to form a light-emitting layer having a thickness of 30 nm in place of co-depositing methylammonium chloride ($CH_3NH_3Cl$), lead(II) chloride ($PbCl_2$). At that time, the concentration of Coumarin 153 was 1% by weight.

Figure 7:
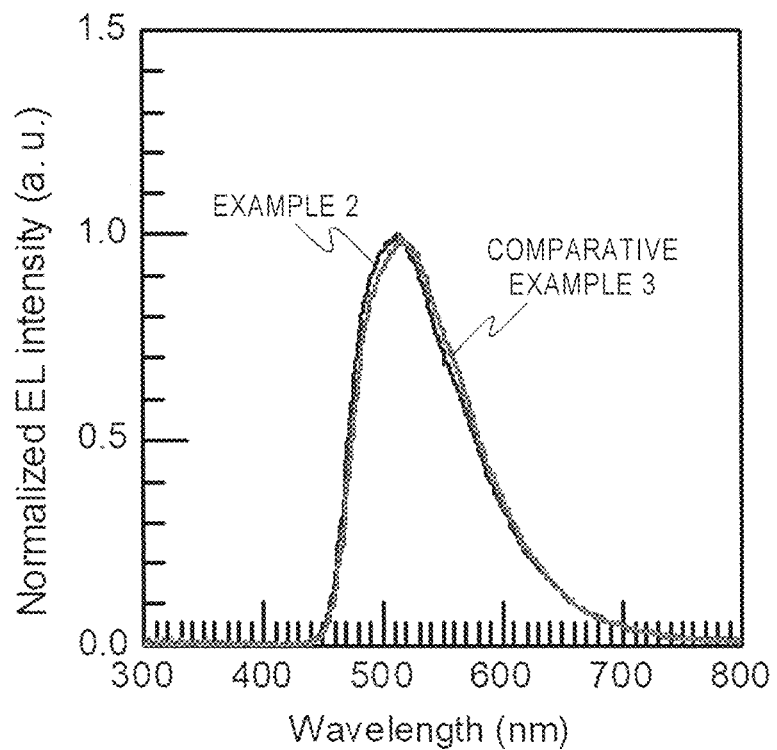
FIG. 7 This shows an emission spectrum of each organic electroluminescent device produced in Example 2 and Comparative Example 3.
Figure 8:
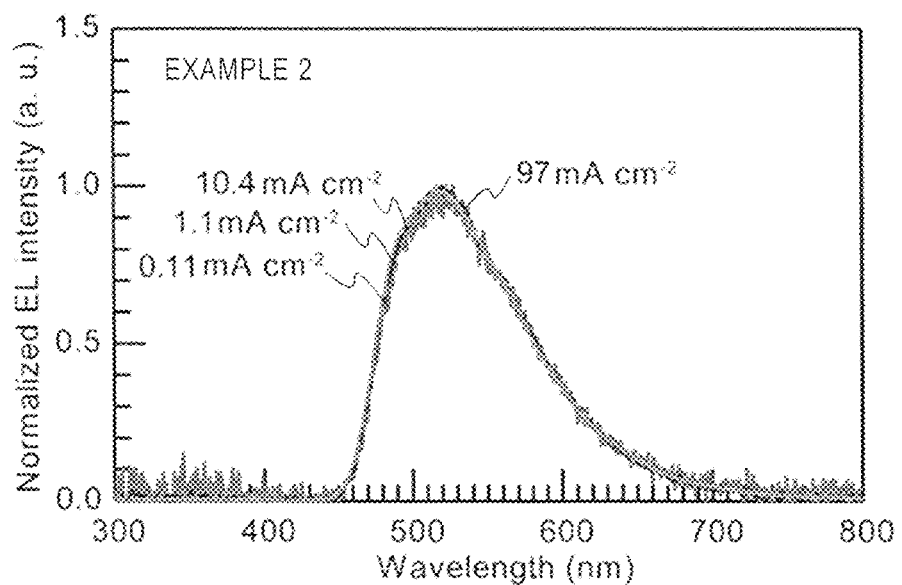
FIG. 8 This shows an emission spectrum of the organic electroluminescent device produced in Example 2, as measured at a varying current density.
Figure 9:
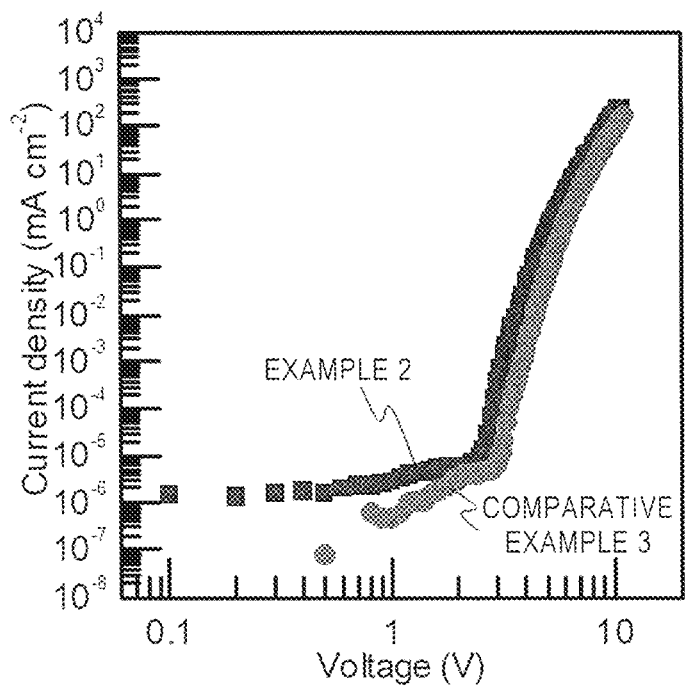
FIG. 9 This is a graph showing a current density-voltage characteristic of each organic electroluminescent device produced in Example 2 and Comparative Example 3.

Emission spectra, as measured at a current density of 10 $mAcm^{-2}$, of the organic electroluminescent devices produced in Example 2 and Comparative Example 3 are shown in FIG. 7; and emission spectra, as measured at a current density of 0.11 $mAcm^{-2}$, 1.1 $mAcm^{-2}$, 10.4 $mAcm^{-2}$ or 97 $mAcm^{-2}$, of the organic electroluminescent device of Example 2 are shown in FIG. 8. Current density-voltage characteristics of the organic electroluminescent devices produced in Example 2 and Comparative Example 3 are shown in FIG. 9; luminance-voltage characteristics thereof are in FIG. 10; external quantum efficiency-current density characteristic thereof are in FIG. 11; and an emission intensity change with time in continuous driving thereof at a current density of 50 $mAcm^{-2}$ is in FIG. 12. In FIG. 12, the vertical axis indicates a ratio of emission intensity to initial emission intensity. Data of drive voltage, maximum external quantum efficiency, current efficiency, power efficiency and half-life measured at a current density of 1 $mAcm^{-2}$ are shown in Table 1. The measured data in Table 1 each are a mean value±standard deviation obtained from measured data of three devices produced under the same condition. The half-life is a time in which the emission intensity reduced to 50% of the initial emission intensity in continuous driving at a current density of 50 $mAcm^{-2}$.

TABLE 1

| Example No | Host Material | Drive Voltage (at 1 mAcm$^{-2}$) (V) | Maximum External Quantum Efficiency (%) | Maximum Current Efficiency (cdA$^{-1}$) | Maximum Power Efficiency (lmW−1) | Half-Life (hr) |
|---|---|---|---|---|---|---|
| Example 2 | CH$_3$NH$_3$PbCl$_3$ | 5.3 ± 0.1 | 2.02 ± 0.11 | 8.32 ± 0.34 | 8.44 ± 0.39 | 514 ± 65 |
| Comparative Example 3 | mCBP | 6.2 ± 0.1 | 1.48 ± 0.13 | 6.11 ± 0.22 | 5.63 ± 0.29 | 543 ± 74 |

Figure 10:
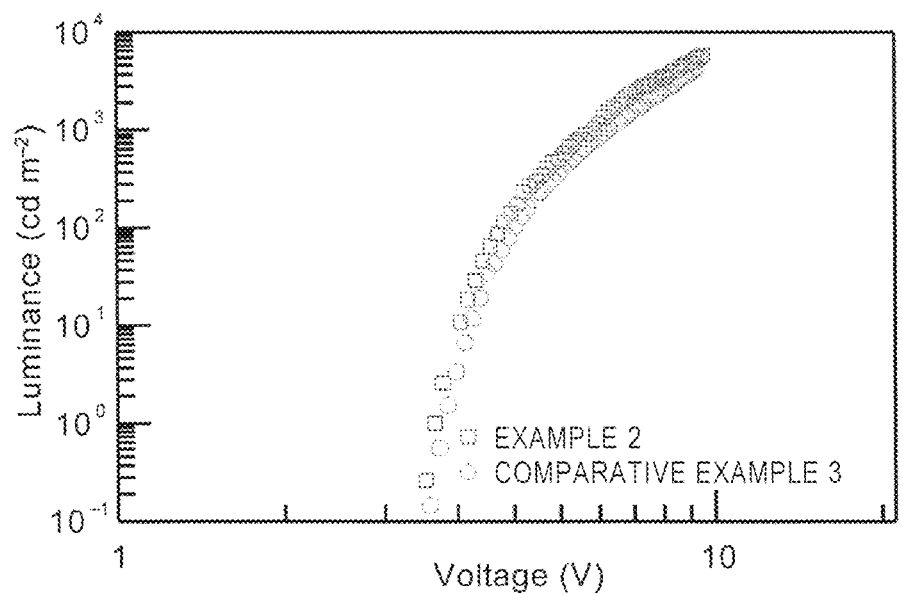
FIG. 10 This is a graph showing a luminance-voltage characteristic of each organic electroluminescent device produced in Example 2 and Comparative Example 3.

As in FIG. 7 and FIG. 10, the organic electroluminescent device of Example 2 has an emission peak in a green region (495 to 570 nm) and has a high luminance. In addition, the emission peak of the device corresponds to the emission wavelength of Coumarin 153, from which it is known that the emission of the device is derived from Coumarin 153. In FIG. 8, the four emission spectra are almost the same, from which is is confirmed that the organic electroluminescent device of Example 2 shows a constant emission spectrum irrespective of current density.

Figure 11:
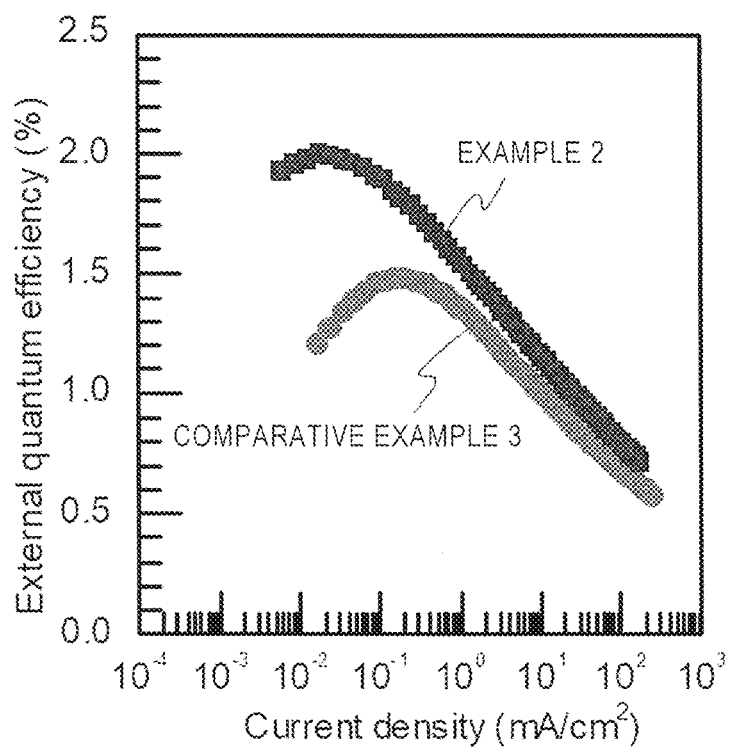
FIG. 11 This is a graph showing an external quantum efficiency-current density characteristic of each organic electroluminescent device produced in Example 2 and Comparative Example 3.
Figure 12:
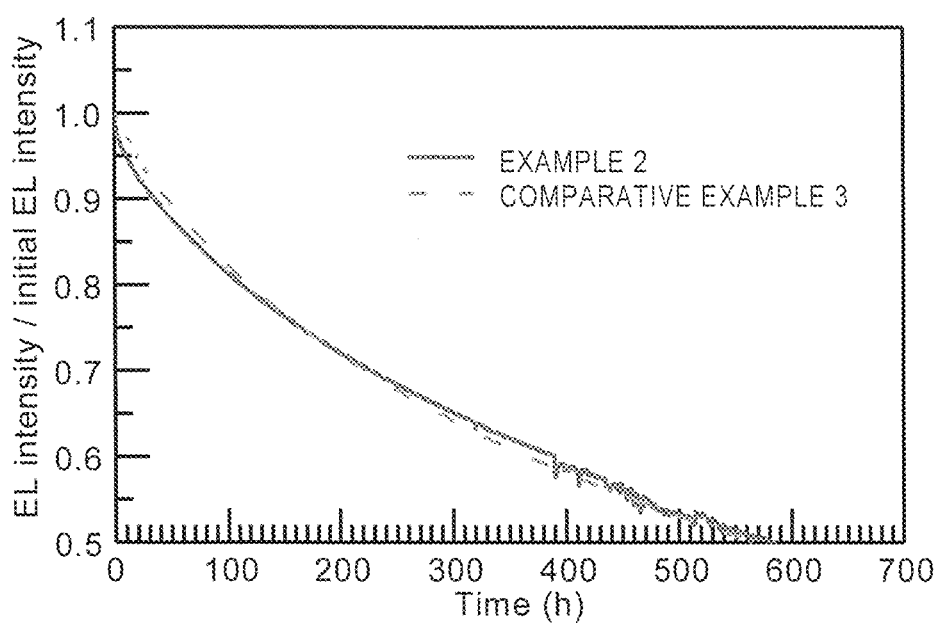
FIG. 12 This is a graph showing an emission intensity change with time in continuous driving of each organic electroluminescent device produced in Example 2 and Comparative Example 3.

As shown in Table 1 and FIG. 11, the organic electroluminescent device of Example 2 using CH$_3$NH$_3$PbCl$_3$ as a host material has a low drive voltage as compared with that of the organic electroluminescent device of Comparative Example 3 using mCBP as a host material, and was excellent in all the external quantum efficiency, the current efficiency and the power efficiency.

Further, as in FIG. 9 and FIG. 10, the voltage of the organic electroluminescent device of Example 2 that attains a current density of 100 mAcm$^{-2}$ is about 9 V (FIG. 9), and the luminance at 9 V is about 5,000 cdm$^{-2}$ (FIG. 10). Namely, the organic electroluminescent device of Example 2 obtained a luminance of about 5,000 cdm$^{-2}$ at a current density of 100 mAcm$^{-2}$. As opposed to this, a white LED utilizing energy transfer from a blue perovskite light emitter to an orange polymer light emitter is reported (Adv. Mater. 2017, 29, 1606859), in which they say that the luminance at 100 mAcm$^{-2}$ is about 100 cdm$^{-2}$. The organic electroluminescent device of Example 2 attained a luminance higher by about 50 times at the same current density than that of the white LED.

As in FIG. 12, the organic electroluminescent device of Example 2 using CH$_3$NH$_3$PbCl$_3$ as a host material has the same operational stability at that of the organic electroluminescent device of Comparative Example 3 using mCBP as a host material. In addition, as in Table 1, the half-life of the organic electroluminescent device of Example 2 is 514±65 hours, and was on the same level as that of the organic electroluminescent device of Comparative Example 3. Here, an electroluminescent device using a perovskite-type compound as a light emitter, different from the present invention, is said to be problematic in point of rapid reduction of emission intensity in continuous driving, and one reason for this is presumed to be an unstable excited state of the perovskite-type compound in a high electric field. As opposed to this, in the organic electroluminescent device of Example 2 using a perovskite-type compound as a host material, it is presumed that, even when the perovskite-type compound has become an unstable excited state, the excitation energy thereof can transfer to a light-emitting material and the unstable excited state can be immediately solved to realize stable operation.

(Example 3) Production of Organic Electroluminescent Device Using CH$_3$NH$_3$PbCl$_3$ as a Perovskite-Type Compound (Host Material) and Using 4CzIPN as a Delayed Fluorescent Material An organic electroluminescent device was produced in the same manner as in Example 2 except that 4CzIPN was used in place of Coumarin 153 to form the light-emitting layer and the concentration of 4CzIPN in the light-emitting layer was 5% by weight.

(Example 4) Production of Organic Electroluminescent Device Using CH$_3$NH$_3$PbCl$_3$ as a Perovskite-Type Compound (Host Material) and Using a Phosphorescent Material Ir(Ppy)$_3$ as a Light-Emitting Material An organic electroluminescent device was produced in the same manner as in Example 2 except that Ir(ppy)$_3$ was used in place of Coumarin 153 to form the light-emitting layer and the concentration of Ir(ppy)$_3$ in the light-emitting layer was 8% by weight.

Figure 13:
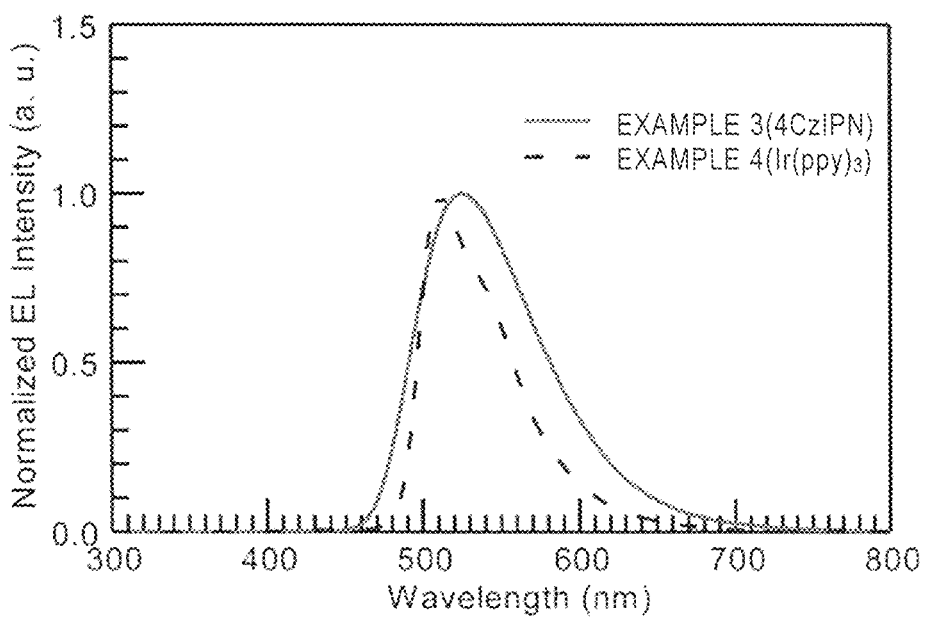
FIG. 13 This is a graph showing an emission spectrum of each organic electroluminescent device produced in Example 3 and Example 4.
Figure 14:
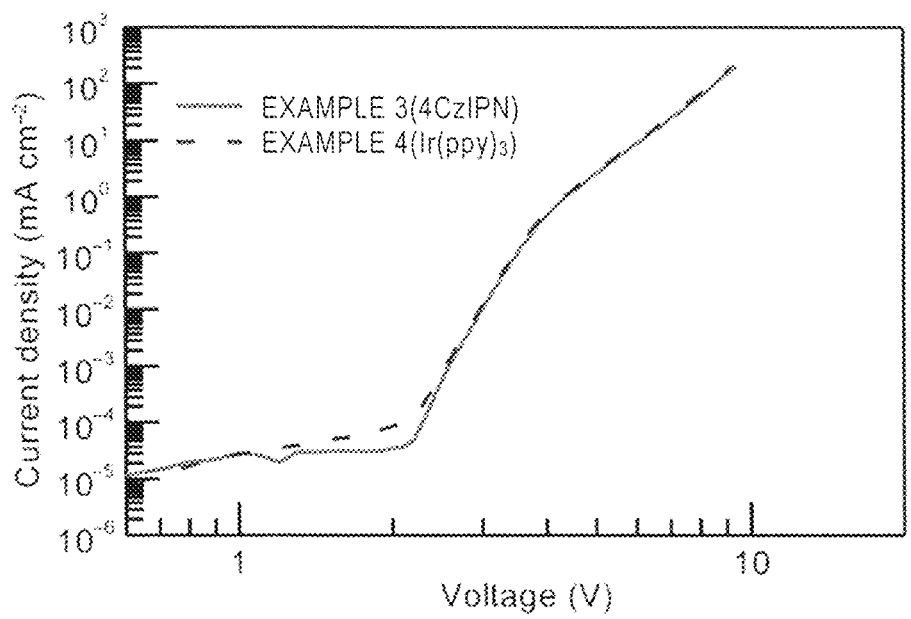
FIG. 14 This is a graph showing a current density-voltage characteristic of each organic electroluminescent device produced in Example 3 and Example 4.
Figure 15:
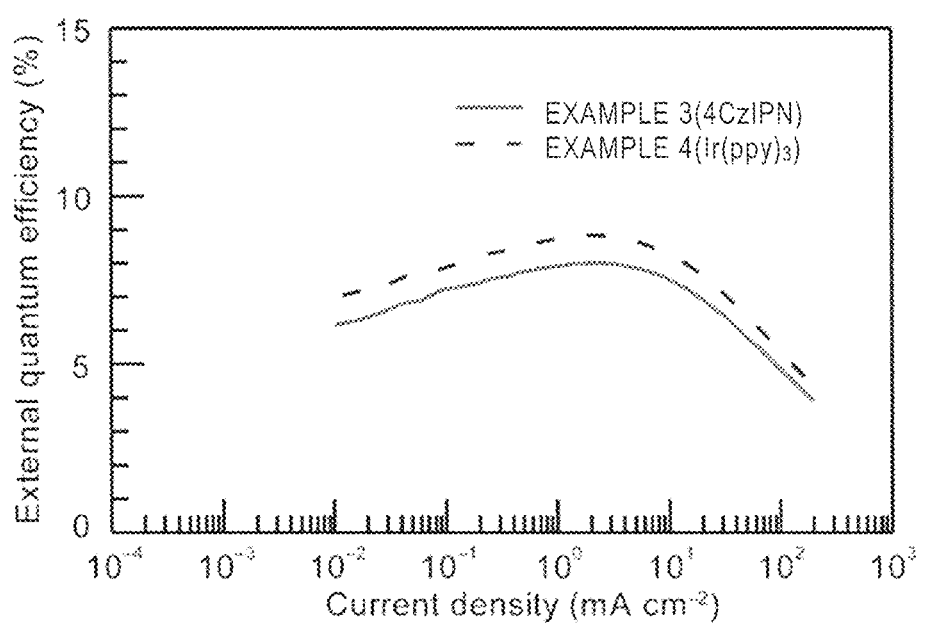
FIG. 15 This is a graph showing an external quantum efficiency-current density characteristic of each organic electroluminescent device produced in Example 3 and Example 4.

Emission spectra, as measured at a current density of 10 mAcm$^{-2}$, of the organic electroluminescent devices produced in Example 3 and Example 4 are shown in FIG. 13; current density-voltage characteristics thereof are in FIG. 14; and external quantum efficiency-current density characteristics thereof are in FIG. 15.

The organic electroluminescent devices produced in Example 3 and Example 4 both attained a high external quantum efficiency of 8 to 9%.

From the above, it is known that using a perovskite-type compound as a host material, the efficiency of organic photoluminescent devices and organic electroluminescent devices can be enhanced. Further, it is known that organic electroluminescent devices of the type can lower drive voltage and can realize good operational stability. Moreover, the coumarin compound used as a light-emitting material in these Examples additionally has a lasing function, and therefore from the results in Examples, perovskite-type compounds are suggested to be applicable also to organic laser devices.

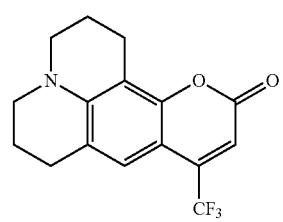

Coumarin 153

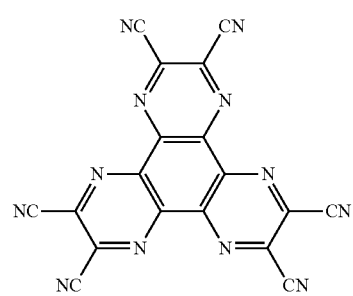

HAT-CN

Tris-PCz

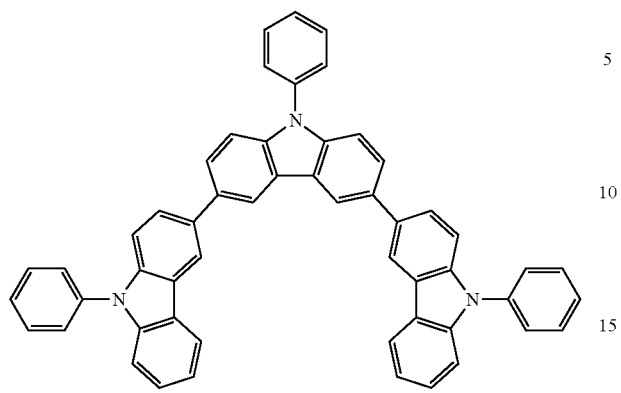

T2T

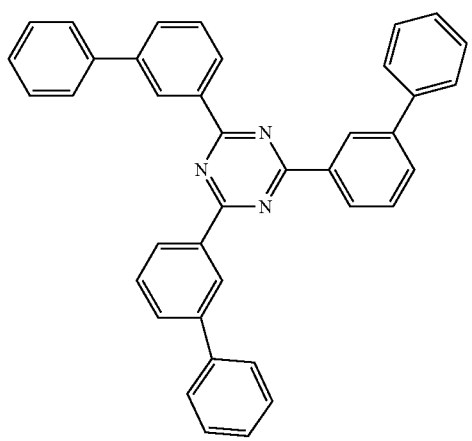

BPy-TP2

mCBP

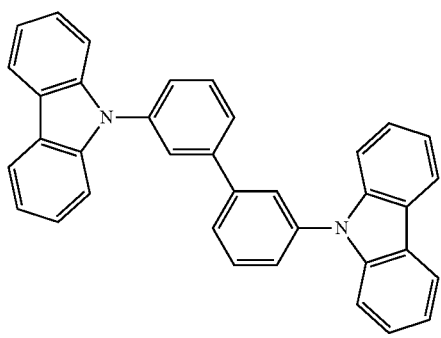

4CzIPN

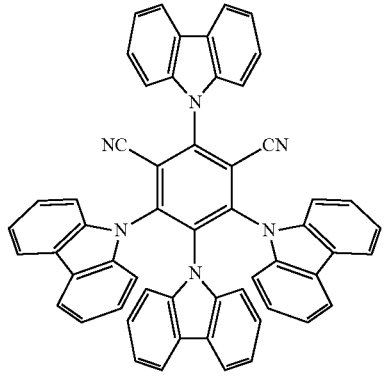

Ir(ppy)$_3$

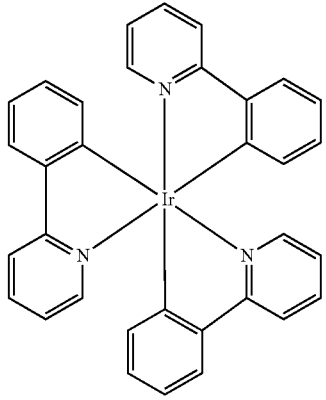

INDUSTRIAL APPLICABILITY

The host material of the present invention has a high carrier mobility and is inexpensive. Therefore, using the host material as a material in a light-emitting layer of an organic light-emitting device, there can be provided an organic light-emitting device having a low drive voltage and a high emission efficiency, and in addition, the material cost of the organic light-emitting device can be reduced. Accordingly, the industrial applicability of the present invention is high.

REFERENCE SIGNS LIST

1 Substrate
2 Anode
3 Hole Injection Layer
4 Hole Transport Layer
5 Light-Emitting Layer
6 Electron Transport Layer
7 Cathode

The invention claimed is:
1. A film comprising a perovskite-type compound and an organic light-emitting material, wherein the perovskite-type compound is represented by the following general formula (4):

$$A^3BX_3 \tag{4}$$

wherein $A^3$ represents an organic cation, B represents a divalent metal ion, X represents a halide ion, and three X's may be the same as or different from each other.
2. The film according to claim 1, wherein carrier mobility of the perovskite-type compound is $10^{-2}$ to $10^3$ cm$^2$V$^{-1}$ s$^{-1}$.

3. The film according to claim 1, wherein the organic light-emitting material emits light by the energy having transferred from the perovskite-type compound.

4. The film according to claim 1, wherein the organic light-emitting material is a compound having a coumarin skeleton.

5. The film according to claim 1, wherein the inclination of a single logarithmic chart on a graph where the horizontal axis indicates a common logarithm of an excitation light intensity irradiating the film and the vertical axis indicates a photoluminescence quantum yield of the film is positive.

6. An organic light-emitting device having a light-emitting layer that comprises a perovskite-type compound and an organic light-emitting material, wherein the perovskite-type compound is represented by the following general formula (4):

$$A_3BX_3 \tag{4}$$

wherein $A^3$ represents an organic cation, B represents a divalent metal ion, X represents a halide ion, and three X's may be the same as or different from each other.

7. The organic light-emitting device according to claim 6, which is an organic electroluminescent device.

8. The organic light-emitting device according to claim 6, wherein the organic light-emitting material emits light by the energy having transferred from the perovskite-type compound.

9. The organic light-emitting device according to claim 6, wherein the organic light-emitting material is a compound having a coumarin skeleton.

10. The organic light-emitting device according to claim 6, wherein the inclination of a single logarithmic chart on a graph where the horizontal axis indicates a common logarithm of an excitation light intensity irradiating the device and the vertical axis indicates a photoluminescence quantum yield of the device is positive.

* * * * *